United States Patent
Ohmaki

(10) Patent No.: US 8,242,539 B2
(45) Date of Patent: Aug. 14, 2012

(54) FIELD EFFECT TRANSISTOR WITH CARRIER TRANSIT LAYER IN MESA HAVING INCLINED SIDES

(75) Inventor: Yuji Ohmaki, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 1081 days.

(21) Appl. No.: 11/886,451

(22) PCT Filed: Mar. 14, 2006

(86) PCT No.: PCT/JP2006/305062
§ 371 (c)(1),
(2), (4) Date: Nov. 16, 2007

(87) PCT Pub. No.: WO2006/098341
PCT Pub. Date: Sep. 21, 2006

(65) Prior Publication Data
US 2008/0173898 A1    Jul. 24, 2008

(30) Foreign Application Priority Data
Mar. 14, 2005  (JP) ................................ 2005-070814

(51) Int. Cl.
*H01L 29/778*   (2006.01)
*H01L 29/06*    (2006.01)
*H01L 29/08*    (2006.01)

(52) U.S. Cl. ............... 257/194; 257/624; 257/E29.253; 257/E29.022

(58) Field of Classification Search ................ 257/183, 257/192, 194, 195, 618, 623, 624, 625, 626, 257/E29.022, E29.166, E29.169, E29.226, 257/E29.242, E29.246, E29.252, E29.253
See application file for complete search history.

(56) References Cited

U.S. PATENT DOCUMENTS 7,247,891 B2 * 7/2007 Kanda et al. .................. 257/194
(Continued)

FOREIGN PATENT DOCUMENTS

| JP | 63-308965 A | 12/1988 |
| JP | 5-182991 A | 7/1993 |

(Continued)

OTHER PUBLICATIONS

Qiao et al., "Transport properties of the advancing interface ohmic contact to AlGaN/GaN heterostructures," Applied Physics Letters, vol. 80, No. 6, 2002, pp. 992-994.

(Continued)

*Primary Examiner* — Lynne Gurley
*Assistant Examiner* — Andrew O Arena
(74) *Attorney, Agent, or Firm* — Birch, Stewart, Kolasch & Birch, LLP

(57) ABSTRACT

A field effect transistor comprises a carrier transit layer in a stacked layer structure provided with a plurality of nitride semiconductor layers, a gate electrode provided on the stacked layer structure and a source electrode and a drain electrode placing the gate electrode in between. The stacked layer structure has a step portion having a side surface exposing an end portion of the carrier transit layer at each side of the gate electrode, the source electrode and drain electrode, which are at least connected to the end portion of the carrier transit layer, are provided respectively on the side surface of the step portion, a part of the source electrode and drain electrode are provided respectively on a surface of an upper step of the step portion, a part of source electrode and drain electrode provided on the upper step of the step portion have, in carrier transit direction, a distance L of L$\leq$10 μm from the side surface to each end portion of the electrodes at the gate electrode side, and in a range of the distance L [μm] from 1 to 10, a contact resistance Rc [Ωmm] of the source and drain electrodes at the distance L determined by TLM method is smaller than a line segment represented by (L, Rc)=(1,2) and (10, 5).

21 Claims, 10 Drawing Sheets

U.S. PATENT DOCUMENTS

2008/0173898 A1* 7/2008 Ohmaki ................ 257/194

FOREIGN PATENT DOCUMENTS

| JP | 5-218099 A | 8/1993 |
| JP | 9-64341 A | 3/1997 |
| JP | 9-82693 A | 3/1997 |
| JP | 2001-102565 A | 4/2001 |
| JP | 2003-45898 A | 2/2003 |
| JP | 2003-100778 A | 4/2003 |
| JP | 2003-258005 A | 9/2003 |

OTHER PUBLICATIONS

Miyoshi et al., Jpn. J. Appl. Phs., vol. 44, No. 9A, 2005, pp. 6490-6494.

* cited by examiner

FIELD EFFECT TRANSISTOR WITH CARRIER TRANSIT LAYER IN MESA HAVING INCLINED SIDES

TECHNICAL FIELD

The present invention relates to a field effect transistor using a gallium nitride based compound semiconductor, more particularly to a field effect transistor having a gate electrode on an upper surface of a mesa structure, a source electrode and a drain electrode on a side surface of the mesa structure.

BACKGROUND ART

A field effect transistor (FET), which is composed of layered nitride semiconductor layers, has been predicted to be a high output power semiconductor device capable of operating at high frequencies with a high breakdown voltage, and a MESFET (Metal Semiconductor FET), a High Electron Mobility Transistor (HEMT) or the like has been proposed. In recent years, a HEMT using a gallium nitride based compound (hereinafter referred to as a "GaN-based HEMT") has attracted attention as a next generation high speed FET. A GaN-based HEMT has excellent properties compared with a Si-based compound, a GaAs-based compound or the like, as will be described below;
1. a wide band gap, a high saturated electron velocity estimated from an electron effective mass;
2. a high breakdown electric field;
3. stability at a high temperature allows wide application areas, such as capability to be used in a high temperature region such as in the vicinity of an internal-combustion gas engine; and
4. a gallium nitride based compound semiconductor itself, which is a raw material, has advantages such as it is basically a nonpoisonous material, so that it is possible to provide a high frequency device with higher output power and a high breakdown voltage that can operate at high temperature.

An example of a GaN-based compound HEMT shown in FIG. 1A comprises an undoped GaN layer 13 which is a carrier transit layer, an undoped AlGaN layer 18 which is a spacer layer suitably securing high mobility even when the wave function of the channel permeates, and an n-type AlGaN layer 14 which is a carrier supply layer (electron supply layer) sequentially stacked on a sapphire substrate 11 via a GaN buffer layer 12. The spacer layer controls the electronic influence of the impurity ions that have released electrons not to reach the channel. Therefore, electrons can transit through the channel without the influence. In addition, on the upper surface of the n-type AlGaN layer 14, a source electrode (hereinafter referred to as a "S-electrode", also simplified as "S") 15, a gate electrode (hereinafter referred to as a "G-electrode", also simplified as "G") 16, and a drain electrode (hereinafter referred to as a "D-electrode", also simplified as "D") 17 are respectively formed. In this HEMT, the layer 14 supplies electrons to the layer 13 and the supplied electrons form a channel in the region 13a which is in contact with the layer 14 in the uppermost layer of the layer 13. When the drain voltage is applied, the electrons are injected to the carrier supply layer 14 from the S-electrode 15. Then, the electrodes transit in the channel 13a with high mobility, and flow into the D-electrode 17 through the layer 14 again. The channel region is controlled according to the voltage applied to the G electrode. Therefore, by controlling the voltage applied to the G-electrode, the amount of electric current between the S-electrode and the D-electrode can be controlled.

Patent Document 1: Japanese Patent Laid-Open Publication No. 2003-045898A
Patent Document 2: Japanese Patent Laid-Open Publication No. H9-082693A
Patent Document 3: Japanese Patent Laid-Open Publication No. H5-218099A
Patent Document 4: Japanese Patent Laid-Open Publication No. H9-064341A
Patent Document 5: Japanese Patent Laid-Open Publication No. 2003-258005A
Nonpatent Literature 1: M. Miyoshi et al., Jpn J. Appl. Phs., Vol. 44, No. 9A (2005), p6490-6494
Nonpatent Literature 2: D. Oiao et al., Applied Physics Letters, Vol. 80, No. 6 (2005), p. 992-994

DISCLOSURE OF THE INVENTION

In order to further increase the power output of such a GaN-based HEMT, resistance component is needed to be reduced to further increase high-efficiency. A factor to lower resistance includes mainly resistance within a channel layer and contact resistance between S-electrode and semiconductor layer and between D electrode and semiconductor layer. Among them, the contact resistance between electrodes and semiconductor layer occurs, mainly, as shown in FIG. 1A, at a contact interface with an electrode layer 15 and 17 provided on the upper surface of the semiconductor layer 14. In another example in which electrode layers are provided as to cover entire surface of a semiconductor layered structure, electric current in a device flows from a region, which is the channel, through AlGaN layer, which is a carrier supply layer, into the electrode layers side. In this structure, when a resistance of AlGaN layer increases, an electric current becomes difficult to flow and a contact resistance at an interface with an electrode increases.

Especially, a GaN-based HEMT has an excellent property compared with a GaAs-based HEMT, in which the breakdown voltage can be increased by one digit while maintaining a low on-resistance. To further improve the breakdown voltage that is specific to the GaN-based HEMT and to use thereof, it is desirable to reduce the amount of dope close to being undoped in the AlGaN layer which acts as carrier supply layer. However, there is a problem in which, when the AlGaN layer is made similar to being undoped, the carrier density decreases and which results in decreasing conductivity and increasing resistivity. Consequently, the contact resistance at an electrode interface increases, and on-resistance increases. If the contact resistance between a layer which acts as carrier supply layer and an electrode is high, the properties of the gallium nitride can not be utilized sufficiently. As described above, especially in the GaN-based HEMT, realizing a high breakdown voltage and realizing a low resistivity have been in trade-off relation.

FIG. 1B shows a device structure in the above-described nonpatent literatures 1 and 2, wherein the source and drain electrodes (hereinafter referred to as "S- and D-electrodes") are formed in a self-aligning manner (literature 1), and locations of forming the electrodes are controlled (literature 2). However, the reliability and productivity of the electrodes, which are in contact with the end portion of the channel, have been insufficient.

In Patent Documents 1 and 2, as to the S- and D-electrodes provided on a mesa side surface, exposing near the mesa upper surface (Literature 1), covering a part of the upper surface (Literature 2) are described. In Literature 5, connecting the D-electrode to the upper layer and the n-type layer at the bottom surface of the groove portion is described. In Patent Literatures 3 and 4, a structure is described in which the S- and D-electrodes is formed so as to straddle over some grooves. However, adaptation of mesa structure and side electrode structure, or semiconductor stacked layer structure differs according to semiconductor material, and a specific structure in the GaN-based FET needed to be made is not described.

The present invention is devised to solve such problems. A major objective of the present invention is to provide a field effect transistor with high efficiency, in which contact resistance at the interface with an electrode is reduced, and to provide a manufacturing method thereof.

To achieve the objectives described above, a basic structure of a field effect transistor (hereinafter also referred to as "FET") of the present invention comprises a carrier transit layer in a stacked layer structure provided with a plurality of nitride semiconductor layers, and a gate electrode provided on the stacked layer structure, a source electrode and a drain electrode placing the gate electrode in between. The stacked layer structure has a step portion having a side surface exposing an end portion of the carrier transit layer at each side of the gate electrode. The source electrode and drain electrode, which are at least connected to the end portion of the carrier transit layer, are provided respectively on the side surface of the step portion, and a part of source electrode and drain electrode are provided respectively on a surface of an upper step of the step portion.

In a FET of a first embodiment of the present invention, in the basic structure described above, when the above-described distance L is 10 μm or less, and the distance L (μm) is in a range from 1 to 10, the value of the contact resistance Rc (Ω·mm) of the source and drain electrodes at a distance L, which is determined by TLM (Transmission line measurement) method, is smaller than the line segment represented by (L, Rc)=(1, 2) and (10, 5). By forming a FET having such a mesa structure in the source and drain electrodes suitable to the basic structure described above, the contact resistance can be reduced, and a FET having excellent on-state resistance and off-state breakdown voltage can be obtained.

In a FET of a second embodiment of the present invention, in the basic structure described above, a part of each source electrode and drain electrode provided on the upper step of the step portion have, in the carrier transit direction, a distance L of $0.1 \leqq L \leqq 5$ μm from the side surface to end portion of respective electrodes at the gate electrode side. Thus, the contact resistance can be reduced and the productivity and reliability can be improved, so that the resistance at on-state can be reduced and a high breakdown voltage at off-state can be obtained.

In a FET of a third embodiment, the semiconductor structure (each layer in the stacked layer structure), mesa structure, and electrode structure are formed so that the contact resistance of an upper step portion of the source electrode and drain electrode is higher than the contact resistance of the end portion of the carrier transit layer at the above-described side surface or adjacent area thereof. Thus, the effect described above can be improved.

A FET according to other embodiments of the present invention may have a structure in combination with each embodiment described above, in which; (1) the stacked layer structure comprises a first semiconductor layer having a carrier transit layer, and a second semiconductor layer of a nitride semiconductor having a larger band gap energy than that of the carrier transit layer on the first semiconductor layer, and a part of the source electrode and drain electrode are provided respectively on the surface of the second semiconductor layer; (2) the source electrode and drain electrode are provided extended to a lower step of the step portion, and the nitride semiconductor layer at the lower step is the same nitride semiconductor layer as the above-described carrier transit layer; (3) the step portion has the gate electrode at an upper step portion between the step portions, the cross-section in width direction of the gate electrode has a mesa structure portion in which a mesa shape of the gate electrode side has a narrower width than that in the carrier transit layer; (4) a part of the source electrode and drain electrode provided respectively on the upper step of the step portion have, in carrier transit direction, a distance L of $0.5 \leqq L \leqq 5$ μm from the side surface to end portion of the respective electrodes at the gate electrode side; (5) in the carrier transit direction, the ratio $d_e/L$ between the width $d_e$ of the side surface of the step portion and the distance L from the side surface to end portion of the respective electrodes of the gate electrode side is 1 to 1/10; and (6) the ratio $h/d_e$ between the depth h of the step portion and the width $d_e$ of the side surface of the step portion in the carrier transit direction is 1/7 to 1/3.

In the above-described embodiment (1), the contact resistance of the source and drain electrodes provided to the upper part of the mesa structure can be set higher than that of the side surface. In the above-described embodiment (2), each electrode may be provided to a lower step so that an electrode having excellent productivity and reliability can be formed. In above-mentioned embodiment (3), a FET in which a mesa structure is an element region provided with the gate electrode. In above-mentioned embodiment (4), each electrode in the mesa structure can be controlled suitably. In above-mentioned embodiment (5), the side surface, inclination thereof and the electrodes thereon can be made suitable to each embodiment of basic structures, and thereby the device properties can be improved. In above-described embodiment (6), the slope of the side surface can be made with a gentle inclination. Thus, FETs with excellent device properties, productivity, and reliability can be obtained.

Also, in the fourth embodiment of the present invention, a suitable integrated structure of element regions can be obtained in a semiconductor device of FET having a plurality of mesa structure portions in the element region, by combination with the above-described embodiments, and further in which; (a) as a mesa structure portion placed between the step portions is an element region, a plurality of element regions are formed in the stacked layer structure, and the source electrode and drain electrode are respectively common electrodes provided straddling the adjacent element regions, and (b) in the stacked layer structure, each of the source electrode and drain electrodes provided to the plurality of the element regions has an interconnecting member to connect each other on the electrode forming layer at the lower step of the step portion among the mesa structure portions.

Each embodiment of the first embodiment may be performed in combination with the second embodiment and each embodiment thereof, or performed individually.

In the fifth embodiment of the second embodiment, (A) in an electrode forming surface, the stacked layer structure comprises a groove surrounded by a step portion or a groove including a plurality of step portions and a plurality of grooves are provided in the source electrode and drain electrode, (B) the groove has a longitudinal shape extending in the carrier transit direction, and (C) the groove is provided extended between the above-described source electrode and drain electrode. According to each structure described above, it is possible to contribute to reduce the contact resistance of the source and drain electrodes.

In a FET of the present invention, a step portion and a mesa structure portion are provided and the contact resistance of S- and D-electrodes can be suitably reduced. Further, a FET and a HEMT capable of realizing excellent productivity and reliability, and still further, a low on-state resistance and a high off-state breakdown voltage can be obtained.

DENOTATION OF REFERENCE NUMERALS

Figure 1A:
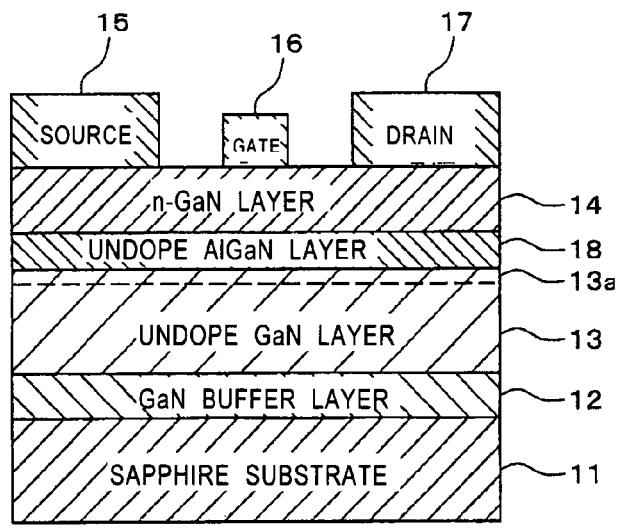
FIG. 1A is a schematic sectional view showing an example of HEMT structure using a GaN-based compound, for comparison to the present invention.
Figure 1B:
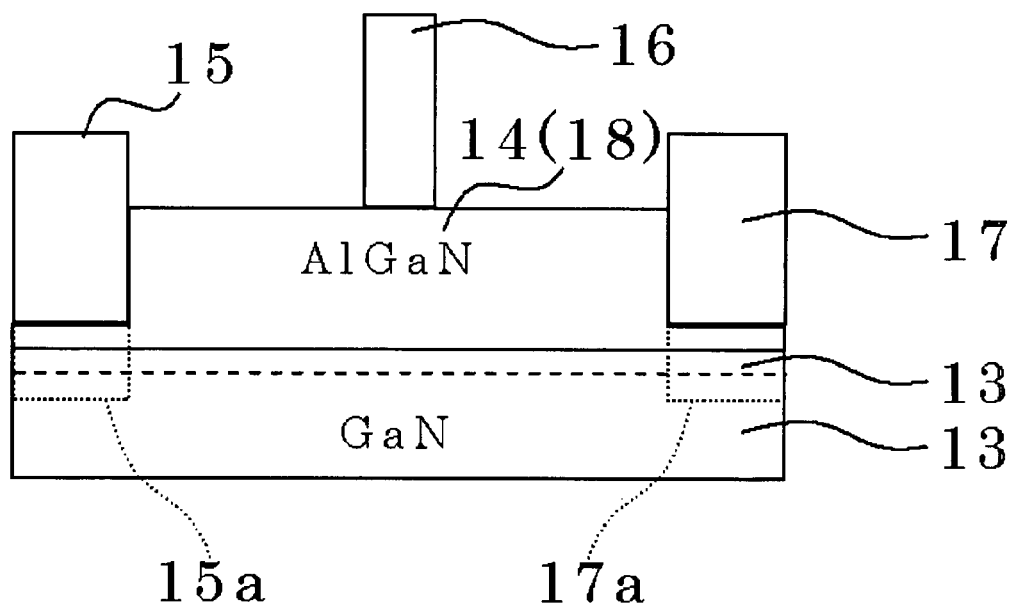
FIG. 1B is a schematic sectional view showing an example of HEMT structure using a GaN-based compound, for comparison to the present invention.

100 HEMT, 200 semiconductor device; 200a a part of device, 1(1A) semiconductor layer (stacked layer structure), 5(5A) electrode layer, 11 sapphire substrate, 12 buffer layer, 13 undoped GaN layer; 13a region, 14 n-type AlGaN layer, 15 to 17 source, gate, and D-electrode, 18 undoped AlGaN layer, 33(23) carrier transit layer; 33a(23a) channel, 34(24) upper layer (carrier supply layer, barrier layer, spacer layer), 20 semiconductor stacked layer structure 35(45, 45C, 65, 85), 185 source electrode; 85p, 185p pad portion; 155 interconnecting member portion; 185C common electrode 36(46, 46C, 66, 86), 186 gate electrode; 186p pad electrode portion; 156 interconnecting member portion 37(47, 47C, 67, 87), 187 drain electrode; 187p pad portion; 157 interconnecting member portion; 187C common electrode 40 step portion; recess portion (40A, 40B stripe raw; 40D rectangular shape; 40F triangular prism shape), 40h terminal edge 140, 241 to 243 mesa structure portion; 140t (243t) upper step portion (upper surface); 140g lower step portion (groove bottom surface); 140e inclined plane (mesa structure side surface, step portion); 141b, 240b to 243b bottom surface portion, 210 to 213 element region

BEST MODE FOR CARRYING OUT THE INVENTION

The embodiments of the present invention will be described below with reference to the accompanying drawings. It should be appreciated, however, the embodiment described below is an illustration of a field-effect transistor and a manufacturing method thereof to give a concrete form to technical ideas of the present invention, and a field-effect transistor and a manufacturing method thereof according to the present invention are not specifically limited to description below. In addition, the present specification will by no means limit the members described in claims to the members described in the embodiments. Especially, size, material, shape, and the relative configuration etc. of the components described in the preferred embodiments are for illustration, and do not intend to limit the invention therein, unless specifically described. In the drawings, the size and the positional relationship of the components may be exaggerated for clarity. Further, in the description below, identical members or members of the same quality are assigned the same names and reference numerals and detailed description thereof will be arbitrarily omitted. In each constituting component of the present invention, multiple components may be constructed using the same member so that one member can serve as multiple components, or vice versa, a function of a member may be shared by multiple members.

Figure 2A:
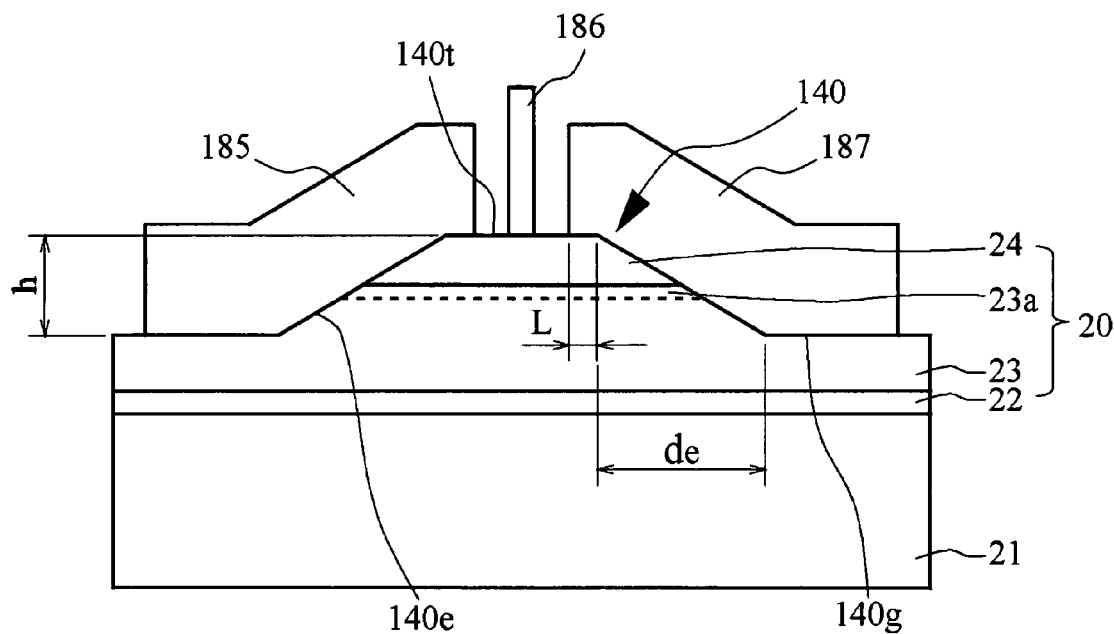
FIG. 2A is a schematic sectional view showing an example of FET according to an embodiment of the present invention.
Figure 2B:
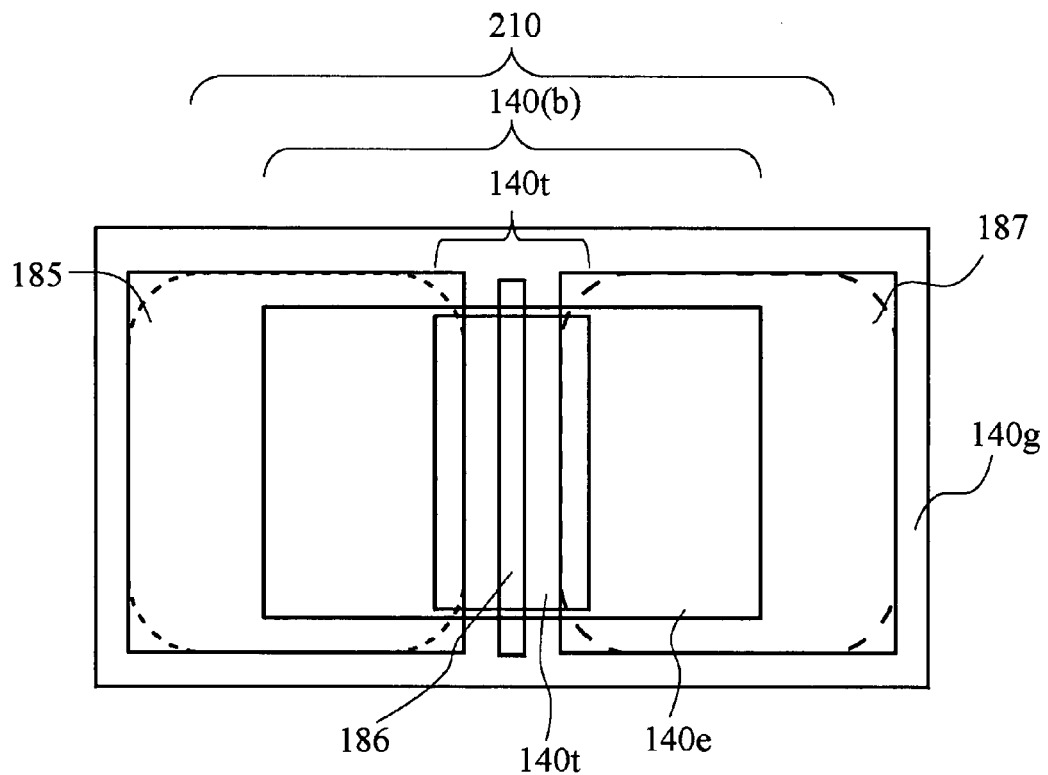
FIG. 2B is a schematic plan view showing an example of FET according to an embodiment of the present invention.

In FIGS. 2A and 2B (sometimes collectively referred to hereinafter as "FIG. 2"; FIG. 2A is a schematic sectional view, FIG. 2B is a schematic plan view), an example composing a GaN-based HEMT 100 is shown as a FET according to an embodiment of the present invention. In HEMT 100 shown in the figure, a carrier transit layer 23 and an upper layer thereof (carrier supply layer) 24 are subsequently stacked, and also a S-electrode 185, a G-electrode 186, and a D-electrode 187 are formed on the upper surface of the upper layer 24. In GaN-based HEMT 100 of this structure, electrons are supplied to the carrier transit layer 23 from the upper layer 24 or from an electrode provided at an end portion, and the supplied electrons transit with high mobility in the channel 23a which is formed at the interface with the carrier supply layer 24 in an upper portion of the carrier transit layer 23. The carrier concentration in the channel 23a is controlled by a depletion layer formed by applying the gate voltage to the G-electrode 186. In this example, an undoped i-type GaN layer as the carrier transit layer 23 and an n-type AlGaN layer as the carrier supply layer are employed. This carrier supply layer is doped with a dopant so as to increase the carrier concentration. However, by reducing the amount of doping or by without doping, the breakdown voltage may be increased. The amount of doping of the n-type AlGaN layer is set from about $10^{18}$ cm$^{-3}$ to about $10^{18}$ cm$^{-3}$, but to increase the breakdown voltage, $10^{18}$ cm$^{-3}$ and less is preferable, and further, the residual electric charge can be made about $10^{16}$ cm$^{-3}$ without doping. The carrier transit layer may be doped with a suitable dopant so as to reduce the transit of carriers in the carrier transit layer other than the channel. In the case where an n-type impurity is doped into the carrier transit layer, unintended current may flow at switch off, due to formation of capacitance with an n- type or n$^+$-type dopant. Therefore, an n$^-$-type dopant is preferable. As described above, the off-characteristic can be controlled by the carrier concentration in the carrier transit layer. In the case of a normally-off type, carrier transit layer is preferably made as an i-type layer, for example, as an undoped layer. On the other hand, a nitride semiconductor layer tends to become n-type due to nitrogen dissociation etc. in its formation, therefore, an p-type impurity may also be doped to a degree that can compensate it. In this specification, the term "undoped" refers to the state in which a dopant is not added intentionally in formation. For example, a dopant concentration is $10^{17}$ cm$^{-3}$ or less or a dopant is not included.

In the carrier transit layer, a semiconductor layer formed on the channel layer comprises at least a second semiconductor layer as an upper layer. For this layer, a barrier layer having a large band gap energy, a spacer layer which is an interposing layer between an electrode, and a contact layer as a lower layer of the S- and D-electrodes may also be provided. According to various FET structures, an insulating film layer may be provided arbitrarily to the underside of the electrode. Also, in this example, a FET is a HEMT which is a unipolar device. However, when the holes are used as carriers, a p-type impurity and a p-type layer are used as above-described dopant and conductive-type layer.

Among each electrode formed on the upper surface of the carrier supply layer 24 (corresponding to layer 34 in FIG. 10B), ohmic electrodes are suitably used for the S-electrode and D-electrode in order to supply electric current to the carrier supply layer or an end portion of the carrier transit layer at the side surface of the step portion, and a Schottky electrode is used for the G-electrode so as to efficiently form the depletion layer formed in the carrier transit layer and to control electrons supplied from the carrier supply layer.

In these electrodes, although not shown in the figures, contact layers can be interposed respectively to obtain ohmic contact and Schottky junction, or a metal layer or an alloy layer made of a plurality of layers or combination thereof may be arbitrarily used. For example, the S-electrode and D-electrode may comprise ohmic electrode at the interface with the ohmic contact layer formed on the carrier supply layer, and the G-electrode may establish Schottky junction properties at the interface which is in contact with the Schottky contact layer formed on the semiconductor upper layer (carrier supply layer).

Figure 7:
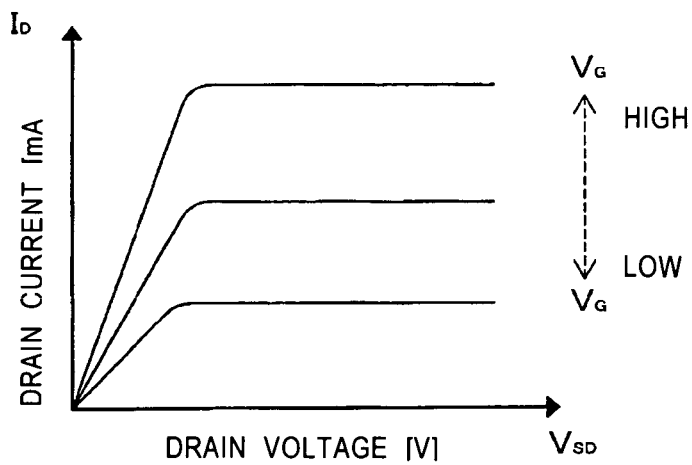
FIG. 7 is a graph showing controlling drain current $I_D$ versus drain-to-source resistance $V_{DS}$ by gate voltage $V_G$.

In the field effect transistor, electrons which are carriers are released from the donors in the upper layer in the carrier supply layer. These carrier electrons tend to be attracted into the channel which has a larger electron affinity and accumulated near the interface, rather than remain in the carrier supply layer. Since the accumulated electrons are not scattered by the dopants, they can transit in the channel with high mobility. On the one hand, as shown in FIG. 7, when a drain-to-source voltage $V_{DS}$ is applied between the S-electrode and the D-electrode, a drain current $I_D$ flows between the S-electrode and the D-electrode via the channel. When a gate voltage $V_G$ is applied to the G electrode, the depletion layer which occurs below the G-electrode extends depends on the applied voltage. Therefore, as shown in FIG. 7, the drain current $I_D$ can be controlled by the gate voltage $V_G$. In addition, the Schottky contact layer which is directly below the G-electrode functions as a barrier layer to control the current (gate leak current) flowing between the G-electrode and the channel. On the one hand, the ohmic contact layer can function to reduce the contact resistance as an ohmic electrode in the S-electrode and D-electrode.

(Nitride Semiconductor Layer)

A GaN-based HEMT comprises a gallium nitride based compound semiconductor. The gallium nitride based compound semiconductor layer may be formed by forming a buffer layer on a substrate according to need, and further, epitaxially growing a carrier transit layer 23 (corresponding to layer 33 of FIG. 10B) and a carrier supply layer 24 (corresponding to layer 34 of FIG. 10B) in sequence, and further, stacking an electrode thereon. The buffer layer is not necessarily needed when a substrate which lattice matches with the epitaxial layer of GaN etc. As a crystal growth method, for example, metal-organic chemical vapor deposition (MOCVD) method, hydride vapour phase epitaxy (HVPE) method, hydride CVD method and MBE (molecularbeam epitaxy) method etc., can be used. The gallium nitride based compound semiconductor is represented by a general formula In$_x$Al$_y$Ga$_{1-x-y}$N ($0 \leq x$, $0 \leq y$, $x+y \leq 1$) and B, P, and/or As may be included in the mixed crystal. Each semiconductor layer and each layer, for example, the carrier supply layer and carrier transit layer are not specifically limited to be a single layer or a multilayer. In addition, an n-type impurity or a p-type impurity may also be arbitrarily included in the nitride semiconductor layer. As an n-type impurity, the Group IV elements such as Si, Ge, Sn, S, O, Ti, and Zr may be used, while Si, Ge or Sn is preferably used, and Si is most preferably used. As the p-type impurity, although it is not specifically limited, Be, Zn, Mn, Cr, Mg, and Ca or the like may be used, and Mg is preferably used. Accordingly, the nitride semiconductor of each type can be formed. As the growth substrate for forming the semiconductor structure, a sapphire substrate and a GaN substrate can be used. Also, a SiC substrate, a CuW substrate etc., which have high thermal conductivity and excellent heat dissipation can be used. As the heat transfer substrate, other metals such as Al, Cu, and W etc., AlN, SiC, diamond, copper diamond, GaN, and Si, and a mixed crystal, an alloy and a mixture thereof may be used. Other than metals, resins and glasses or the like, the material composition and shape are not limited as long as the substrate can conduct heat.

(Source Electrode 35 (185), Gate Electrode 36 (186), Drain Electrode 37 (187))

Electrodes such as the S-electrode 35, G-electrode 36, and D-electrode 37 are typically formed with a composition different than the semiconductor material constructing the device. For example, a material having excellent electrical conductivity such as Ti, Al, Cu, W, Au, Ag, Mo, Ni, Pt, In, Rh, Ir, and Cr are used. It is also not limited to metal materials. Conductive oxides, conductive plastics having electric conductivity and the like may be used. Further, the electrode is not only made of a single element material but also made of a plurality of elements by forming such as an alloy, eutectic crystal and mixed crystal. For example, ITO and zinc oxide (ZnO) etc. can be used. Moreover, a layer structure comprising two or more layers may be employed. Preferably, a Ti/Al-based electrode as an example of ohmic electrode for the AlGaN-based or the GaN-based semiconductor layers, and an electrode made of Ni/Au-based material as an example of Schottky electrode are employed. With this, ohmic properties, Schottky properties and the like, functions needed for an electrode for HEMT can be suitably performed. For example, in order to obtain ohmic contact with the S-electrode and D-electrode, Ti/Pt-, Ti/Au-, TiAl-, or V/Al-based metals are used, and annealing is conducted at a temperature such as from 800° C. to 950° C. For the G-electrode, W/Au, Ni/Au, or Au, Cu, Ni etc. are used. Although the cross sectional shape of the G-electrode is not limited to a T-shape and a I-shape and the like, when the cross section of the G-electrode is made with a T-shape, cross sectional area of the electrode increases and electrode resistance can be reduced, so that performance at a high frequency operation can also be improved. Also, in view of adhesion etc. between the ohmic electrode and the wires, a pad electrode may be formed on the contact surface with the semiconductor layer. A metalization layer (bump) for connecting with an external electrode etc., is suitably formed on the pad electrode. The metalization layer comprises materials such as Ag, Au, Sn, In, Bi, Cu, and Zn. The electrode forming surface side of the field effect transistor may be placed facing the external electrode provided on the submount, and then each electrode may be bonded with a bump. To the submount, a wire and the like may be provided. In the present specification, for example, "Ti/Al" represents a structure in which Ti and Al are subsequently stacked from the semiconductor side.

It can be also possible to provide the G-electrode to a place where a part or whole of the buffer layer is removed, or to form a device structure in which the G-electrode is facing the S- and D-electrodes with intervening semiconductor structure. With this, negative effect of the buffer layer, that is typically leak current and off current, can be reduced. Therefore, electric properties of the FET can be improved. Moreover, adhesion between the electrode and the semiconductor layer can also be improved. In addition, areas between the source electrode and gate electrode and between the gate electrode and drain electrode which are the surface of the HEMT may preferably be covered with a protective film. As such protective film, silicon nitride, aluminum oxide, niobium oxide film etc., may be cited. If the protective film is made of SiN which is stacked by sputtering etc., it is preferable in view of the physical properties of HEMT. A film including an insulating film made of aluminum oxide film ($Al_2O_3$) is more preferable. Current leakage properties of the insulating film using aluminum oxide film shows good insulating properties across a wide range of superimposed voltage compared to SiN film. Therefore, with relation to the nitride type semiconductor (among them, especially with AlGaN, more preferably $Al_{0.2}Ga_{0.8}N$), especially aluminum oxide film is preferable.

When the substrate and buffer layer are removed, formation of leak pass due to generation of leak current formed by the presence of the buffer layer can be prevented. Therefore, it is preferable. This can also be prevented by removing not only the substrate but also the buffer layer. For example, after the substrate is removed, a part of the semiconductor structure is ground to remove the buffer layer. In addition, crystallinity of the buffer layer in initial growing stage and underlayer tend to be inferior and in such cases, the portion becomes a leak path. Therefore, it is preferable to remove it to a depth with inferior crystallinity and then form the carrier supply layer, the carrier transit layer, and the first and second semiconductor layers. If the substrate is removed entirely, removal of the buffer layer can be carried out with ease.

The step portions (40, 140e to 143e, 240e) or the mesa structure portions (140 to 143, 241 to 243) are formed by etching etc. performed on the semiconductor stacked layer structure 1A, 20 such as the carrier transit layer 33 and the carrier supply layer 34. Etching can be carried out by way of, for example, RIE (reactive ion etching) and ion milling via a mask such as resist pattern and protective pattern. Similarly, a step structure may be formed by other methods, such as forming a step structure by regrowth using a difference in the growth rate of the crystal. More specifically, it is possible that after growing a carrier transit layer, a part thereof is covered with a protective film or $SiO_2$ etc., then the opening portion is selectively grown to obtain a step structure.

FIRST EMBODIMENT

Step Portion, Mesa Structure Portion

To the step portion (140e) and mesa structure portion 140 of the first embodiment of the present invention, as shown in the schematic sectional view of FIG. 2A, at least one of S-electrode and D-electrode, specifically at least D-electrode, preferably the both, may be formed on a side surface 140e of the step portion, with apart of respective electrode extending to the upper step 140t of the step portion. Specifically, respective electrode is formed extending to the lower step 140g (240g) of the step portion. The electrode of the side surface portion is formed in such way that at least an end portion of the carrier transit layer 23 is exposed as a part of the semiconductor stacked layer structure 20 at a side surface, and the electrode is provided so as to be electrically in contact with the exposed portion, preferably directly contact with the exposed portion.

In a specific example, a mesa structure portion 140 which is placed between the step portions is provided to the semiconductor structure 20. Then, the mesa structure portion 140 is as the device region 210, the carrier transit layer of the device is provided. The G-electrode is, as in Example 1, formed on the mesa structure portion 140t. However, the side of the semiconductor structure which faces the mesa structure portion 140 may be used as the G-electrode forming surface.

A basic structure according to the present invention is as described above and comprises the components suitable to this structure which will be described below.

Figure 5:
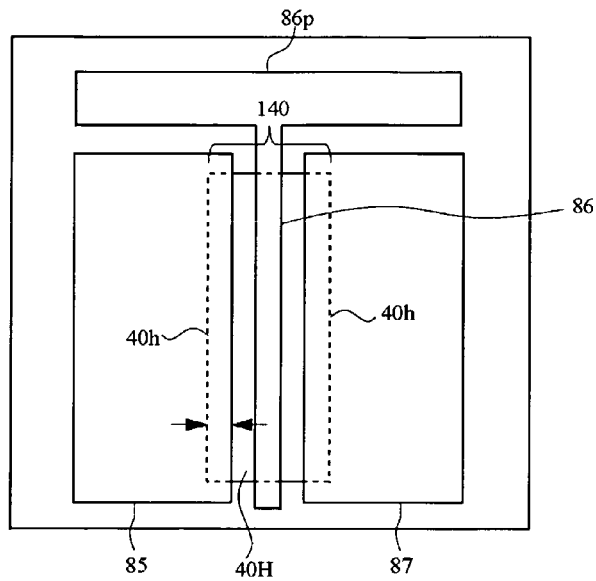
FIG. 5 is a schematic plan view showing an example of FET according to an embodiment of the present invention.

As an embodiment, as shown in FIGS. 2, 5 etc., the distance L between an end portion of the G-electrode side of a part of the electrode provided on the upper step 140t (FIGS. 2A and 2B) of the upper step portion and a side surface of an end portion of the upper step of the step portion is $0<L\leq 10$ μm, preferably in a range from 0.1 μm to 5 μm. This is because if it is 0.1 μm or less, a part of electrode at the upper step portion becomes microscopic, which leads a tendency of inferior productivity and reliability. Also, influence of the location accuracy of each electrode, especially of the G-electrode, and distance accuracy between each electrode and the G-electrode, increase as the factors affecting device performance. When it is 5 μm or less as shown in FIG. 8 to be described below, the contact resistance of TLM can be sufficiently reduced.

Figure 8:
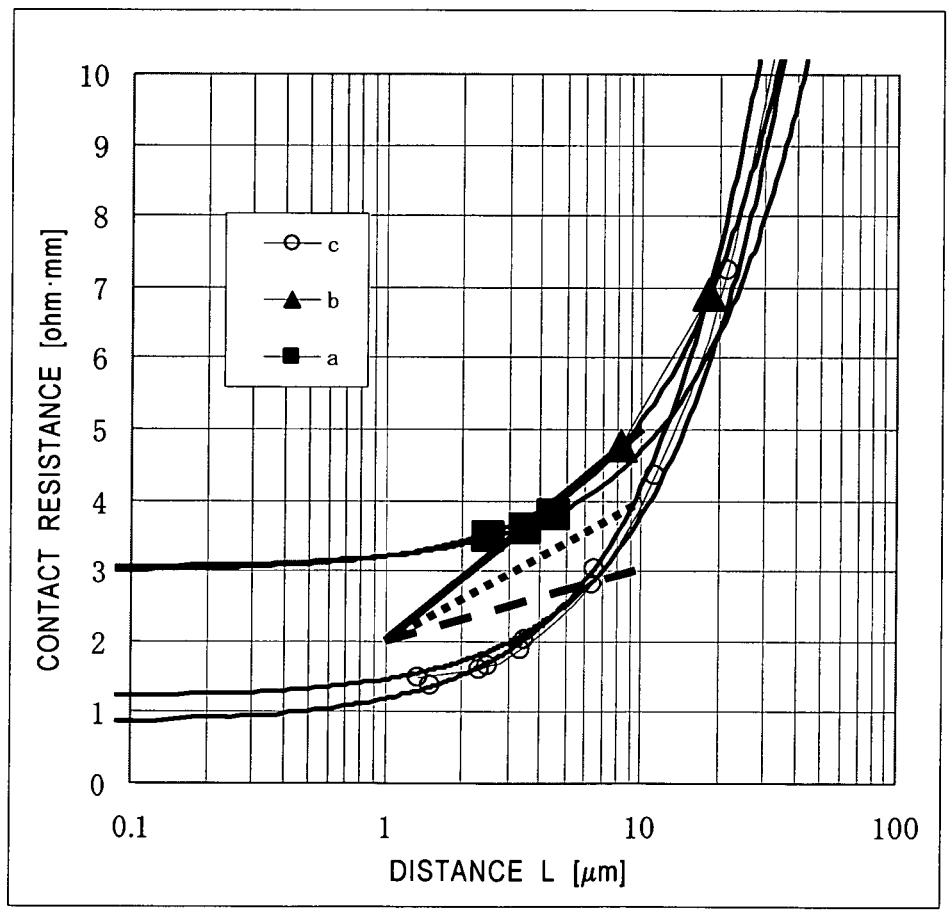
FIG. 8 is a graph showing relationship between distance L and contact resistance Rc according to an embodiment of the present invention.

In another embodiment, a semiconductor structure and step structure having the S- and D-electrodes provided on the side surface 140e and the upper surface 140t of the mesa structure 140, as described above, in which, in the relationship between the above-described distance L and the contact resistance $R_c$ measured by TLM, as shown in FIG. 8, the contact resistance is as such that it is equal or less than the line segment in a region of $L\leq 10$ μm, especially in a region of 1 μm$\leq L\leq 10$ μm, when (L [μm], Rc [Ω·mm]) is, between (1, 2) and (10,5) (solid line in the figure), preferably between (1, 2)

and (10, 4) (dotted line in the figure), most preferably between (1, 2) and (10, 3) (dashed line in the figure) are used. This is as shown in FIG. 8 and the line segments in the figure, conditions such as the roughness of the processed surface, the shape and inclination of the side surface vary due to processing conditions of the mesa structure. Consequently, the relationship between the distance L and the contact resistance Rc for a FET structure suitable to the present invention is as shown as the resistance value which is equal or less than a line segment shown in the figure.

Figure 6:
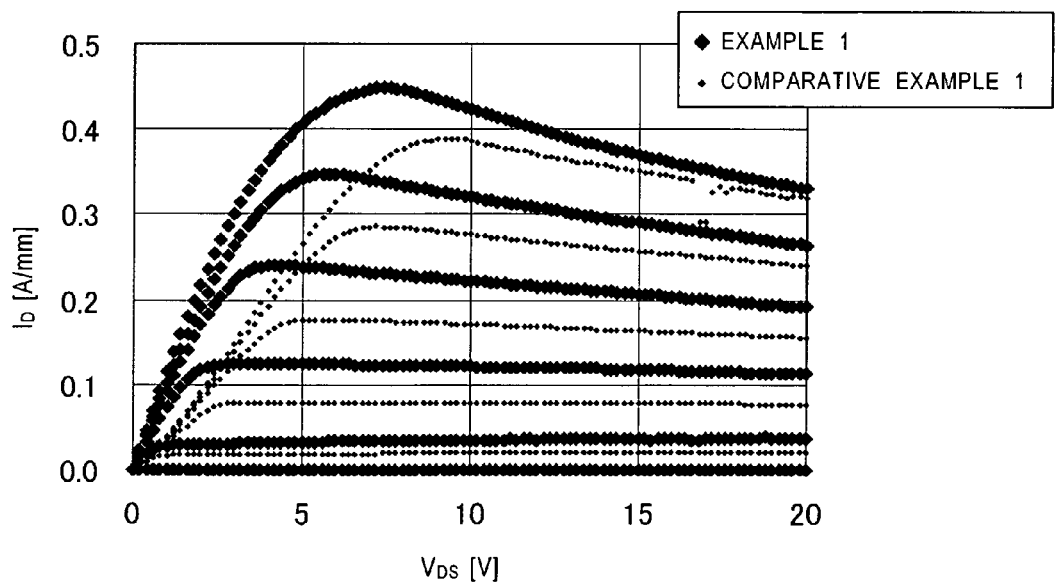
FIG. 6 is a graph showing static characteristic of a HEMT according to Example 1 and Comparative Example 1 of the present invention.

FIG. 8 shows the results of TLM measurement obtained in the device having the S- and D-electrodes of Example 1, using various mask materials of (a) $SiO_2$, (b) positive resist, and (c) negative resist, with the contact resistance in the longitudinal axis and the distance L in the lateral axis. The mask materials capable of satisfying the above-described conditions are resist (b) and (c), preferably resist (b). With further examination, respective properties according to each mask material will become apparent, however, their approximating curves show similar tendency. The static characteristic of HEMT of Example 1 shown in FIG. 6 is obtained by using (b).

Thus, with the relationship between the distance L and the contact resistance Rc being as described above, a device having good properties with the step structure, mesa structure and source and drain electrodes of the present invention can be obtained.

In an embodiment of the present invention, the contact resistance of a part of the electrode at the upper step portion 140t is arranged to be greater than that of the side surface 140e, at least the end surface portion of the carrier transit layer, and preferably 10 to 100 times or more greater. Also, similarly, the contact resistance of the lower step portion, where each electrode is provided extended thereto, with a part of the electrodes is arranged to be greater than that of the side surface preferably 10 to 100 times or more greater. Accordingly, carrier supply and discharge from the electrode at the end portion of the carrier transit layer can be performed suitably.

As described above, the basic structure of the semiconductor structure and the semiconductor stacked layer structure which constructs thereof at least comprise a carrier transit layer. Between the carrier transit layer 23 and each electrode, especially the source electrode 185 and drain electrode 187, a barrier layer having larger bandgap energy than that of the carrier transit layer, a spacer layer controlling the device properties, or the like are provided. Further, an upper layer 24 of the carrier transit layer such as a carrier supply layer is provided. Moreover, between the source and drain electrodes and the carrier transit layer, a contact layer and the like is provided to reduce the contact resistance. In the above-described embodiment, in order to obtain high resistivity in the contact resistance, as shown in the example, a layer having larger band gap energy than that of the carrier layer is used for the electrode forming layer in the semiconductor structure 20 at the upper step portion of the source and drain electrodes. In addition, as for the dopant, the amount of doping in the electrode forming layer is set smaller than that of the semiconductor layers locating below the electrode forming layer, such as the carrier supply layer or the barrier layer and the spacer layer and the like above it. Thus, higher resistivity in the contact resistance can be obtained. In the relationship between the barrier layer and the source and drain electrodes forming layers at the upper step portion, the band gap energy of the barrier layer may be smaller, however, in consideration of crystallinity, the band gap energy of the barrier layer is set larger. Also, in the case where a spacer layer is interposed therebetween, when the band gap energy is set as barrier layer>electrode forming layer>spacer layer, the contact resistance of the upper step portion can be increased while maintaining crystallinity.

The embodiments described above can be applied in combination, and likewise in the embodiments below.

In an embodiment, at least one of source and drain electrodes is formed extended to the lower portion of the step portion, and thus each electrode structure can be formed with good controllability. Also, the electrode forming layer at the bottom surface 140g is made of the same layer as the carrier transit layer. Accordingly, in the vicinity of the channel, the connection with each electrode can be obtained preferably in a similar way as in the end portion of the carrier transit layer. Also, the area apart from the channel can be made with a higher contact resistance so that the carrier can be selectively guided to the carrier transit layer.

Figure 3:
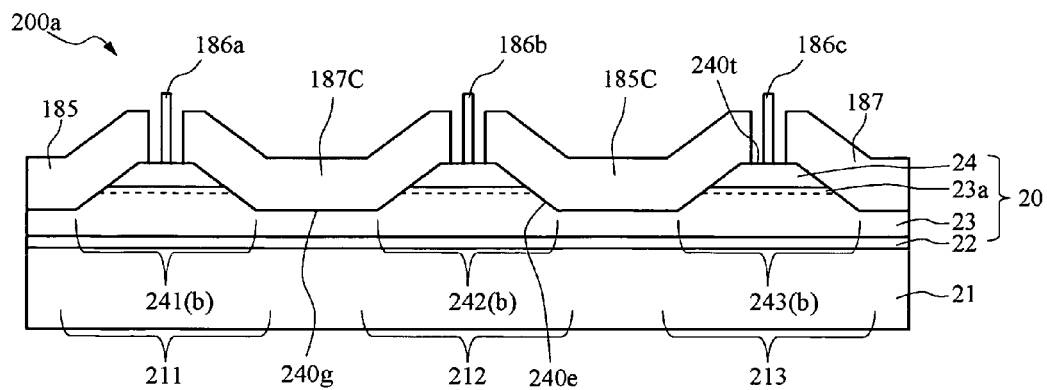
FIG. 3 is a schematic sectional view showing an example of FET and device thereof according to an embodiment of the present invention.

In another embodiment, as shown in FIGS. 2 and 3, when the mesa structure portion 140 is placed between the step portions 140e (FIGS. 2A and 2B), 240e (FIG. 3) and formed wider at the bottom surface 140b (FIG. 2B), 241(*b*) to 243(*b*) (FIG. 3) side than the upper surface 140t (FIGS. 2A and 2B), 240t (FIG. 3) side, respective electrodes 185 to 187 and the forming location and area thereof can be adjusted suitably. Accordingly, the FET with good productivity and suitable properties can be obtained.

In another embodiment, as shown in FIG. 2, the distance L is adjusted in a range of $0<L\leq 10$ μm, preferably in a range of $0.1\leq L\leq 5$ μm. Accordingly, a FET excellent in productivity and reliability and having a low contact resistance can be obtained.

In yet another embodiment, as shown in FIG. 2, in the carrier transit direction, $d_e/L$ that is the ratio between the width $d_e$ of the side surface of the step portion and the distance L from the side surface to respective end portion of the electrodes at the G-electrode side is arranged in a range from 1 or less to $1/10$ or greater, preferably in a range from $1/2$ or less to $1/5$ or greater. In still another embodiment, $h/d_e$ that is the ratio between the height h of the step portion and the width $d_e$ of the side surface of the step portion in the carrier transit direction is arranged preferably to be $1/10$ or greater and $1/10$ or less. With this arrangement, by forming the inclination of the step portion (side surface) with a gentle slope, a device capable of realizing each property described above can be obtained. If the inclined plane is steep, the connection with the end portion of the carrier transit layer may be insufficient, reliability of the connecting portion between the part of the electrode at the upper step and the side surface may be decreased, and a portion affected by annealing of the electrode may reach a deeper part of the device and become a factor which leads deterioration of the device performance. Such situation can be prevented and specifically, in combination with the above described respective embodiments and structures, an excellent device can be obtained.

Example 1

The GaN-based HEMT of Example 1 comprises, as shown in the schematic sectional view of FIG. 2A and the schematic plan view of FIG. 23, an undoped i-type GaN layer as a carrier transit layer 23, an undoped i-type AlN layer of 7.5 nm and an i-type AlGaN layer of 25 nm stacked in sequence thereon as a barrier layer and upper layer 24, and as a step portion 140e, a mesa structure portion having an upper step portion 140e of about 21 μm in width, a lower step portion 140t of about 22 μm in width (at the side surface 140e, the cross section is about 0.5 μm in width and about 80 nm in height) is provided.

For example, in the above-described example shown in FIG. 5, the step portion 40 is extended from either side of the G-electrode 36 to a position passing through the S-electrode 35 and D-electrode 37. However, as shown in FIG. 5, the step portion 40H may be extended from the both sides of the G-electrode 86 to some extent along the S-electrode 85 and D-electrode 87, and also may be cut into pieces. In the example shown in FIG. 5, the end edge 40h of the step portion 40H is extended to the position at a predetermined distance L from the electrode end, and directly below the S-electrode 85 and D-electrode 87. By optimizing L, resistance can be controlled at minimum value. According to calculation, in the case where the step portion is planar, when the range is $0<L(\mu m)\leqq 10$, preferably $0.1\leqq L(\mu m)\leqq 5$, and in manufacturing, preferably $0.5<L(\mu m)\leqq 5$, the contact resistance can be reduced sufficiently.

Further, in a second embodiment hereinafter described, with the structure shown in FIG. 5, the step portion 40H is not formed in a stripe shape or polygonal shape but in a planar shape. If the shape of the step portion is polygonal or stripe, the carriers can not be caught up to the edge of the step portion, and some of the carriers in the vicinity of the side wall of the step portion may escape to the carrier supply layer locating above. However, in a structure where the step portion is provided as pieces as described above, all the carriers diffusing further than the distance L from the end edge of the electrode are captured at the side wall portion of the end edge of the step portion having a low resistance, so that the resistance at the interface can be reduced. Similarly, in the case where the carriers are injected from the S-electrode, the resistance at the interface with the semiconductor layer can be reduced by injecting the carrier from the side wall portion of the end edge of the step portion. Especially, when the carrier supply layer which is the electrode forming layer at the upper step portion has high resistance such as undoped layer, as in the second embodiment hereinafter described, a structure shown in FIG. 5 is preferable because the resistance increases when a polygonal shape, a stripe or the like, a component which interposes the carrier supply layer is provided. Also, the structure is simple so that manufacturing yield in the process forming the step portion can be improved.

In Comparative Example 1, a GaN-based HEMT is formed in a similar manner as in Example 1, except that the carrier supply layer is made of n-type AlGaN layer and the step portion is not formed. FIG. 6 shows the drain current $J_D$ versus the drain to source voltage $V_{DS}$, as static characteristic obtained by these HEMT. In FIG. 6, large filled circles show the HEMT of Example 1 and small filled circles show the HEMT of Comparative Example 1, respectively. Here, the gate voltage $V_G$ is changed from 1V to −6V at intervals of 1V. The TLM evaluation shown in FIG. 8 is performed by providing a pattern for the S- and D-electrodes to the mesa structure 140 of the present example.

Figure 14:
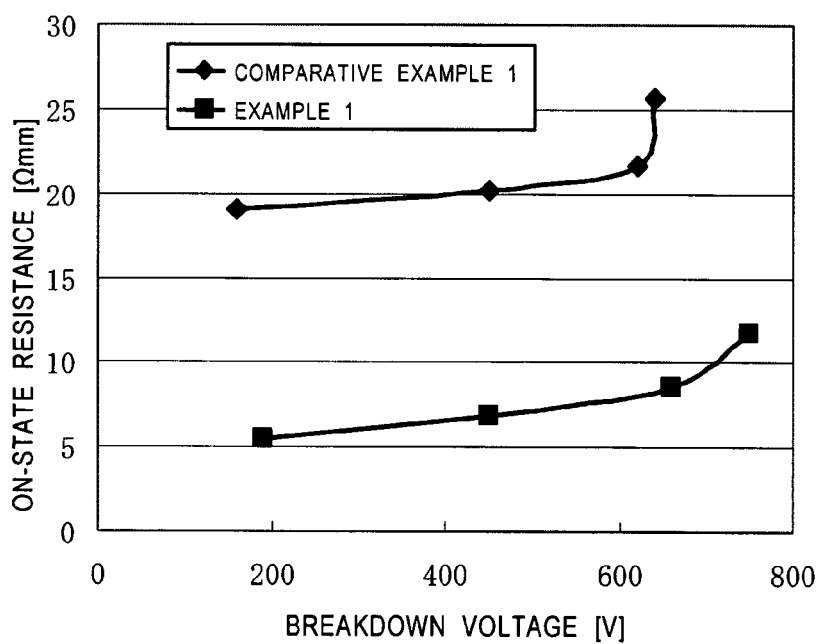
FIG. 14 is a graph showing on-resistance characteristic of a HEMT according to Example 1 and Comparative Example 1 of the present invention.
Figure 15:
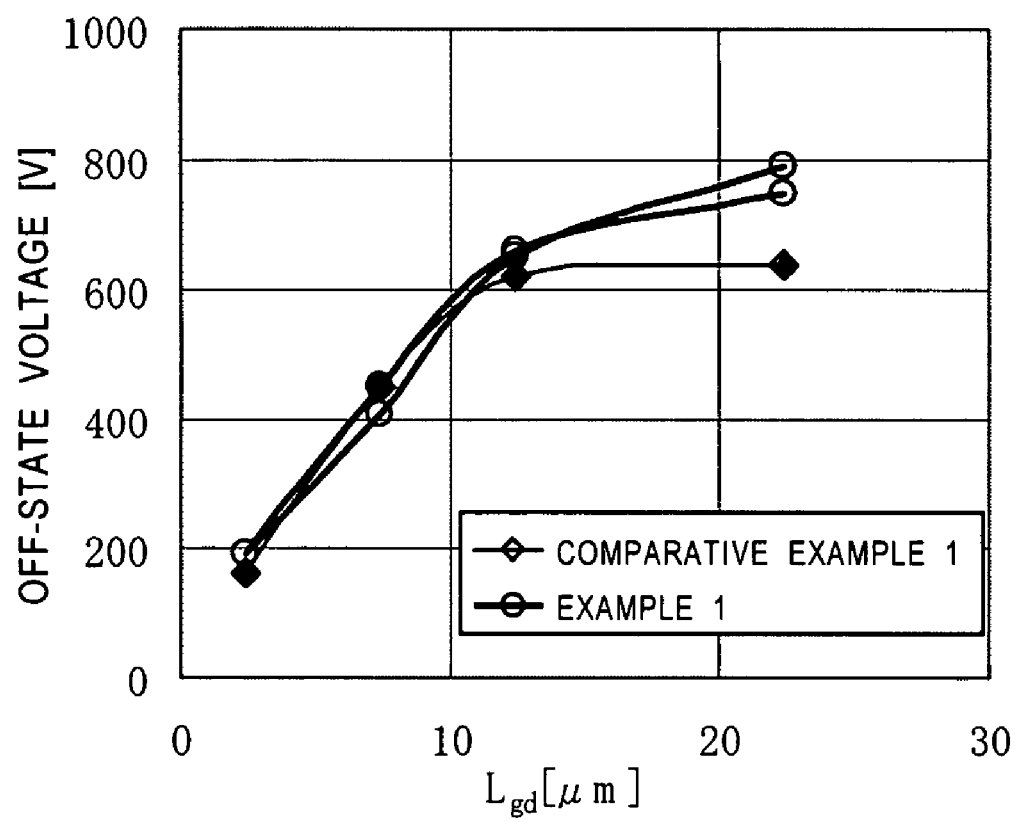
FIG. 15 is a graph showing off-resistance characteristic of a HEMT according to Example 1 and Comparative Example 1 of the present invention.

The on-state resistance and off-state breakdown voltage characteristics of the HEMT of Example 1 and Comparative Example 1 obtained as described above are shown in FIGS. 14 and 15 respectively. The dots in the figures represent the distance $L_{SD}$ between the S- and D-electrodes at, from the left side of the figures 7.5, 12.5, 17.5, and 27.5 μm, respectively. As shown in these characteristics figures, Example 1 can realize the breakdown voltage of over 600 V and the on-resistance of 8.5 Ω·mm. Therefore, compared with Comparative Example 1, a low on-state resistance and a high off-state breakdown voltage can be realized. That is, the on-state resistance can be decreased while maintaining a high breakdown voltage.

A method of manufacturing the FET according to the present invention will now be described below with reference to a method of manufacturing of Example 1.

(Method of Manufacturing Field Effect Transistor)

Figure 10A:
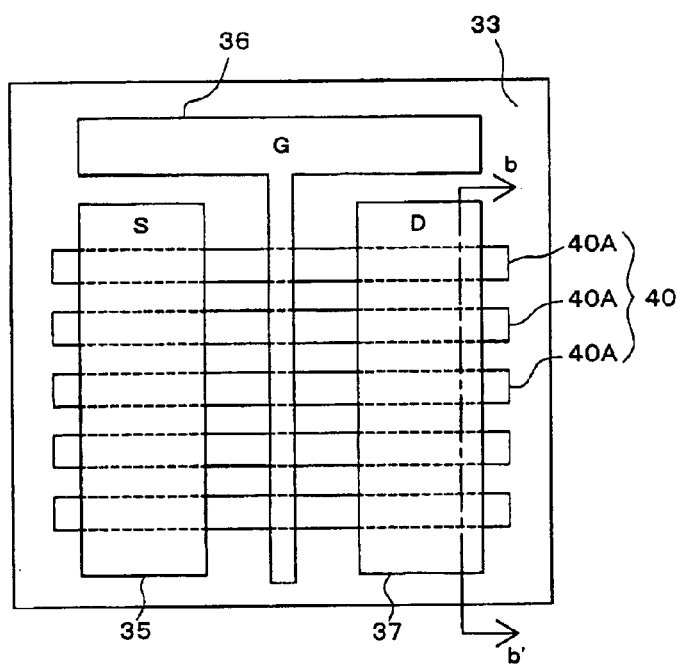
FIG. 10A is a schematic plan view showing an example of electrode structure of FET according to an embodiment (second embodiment) of the present invention.
Figure 10B:
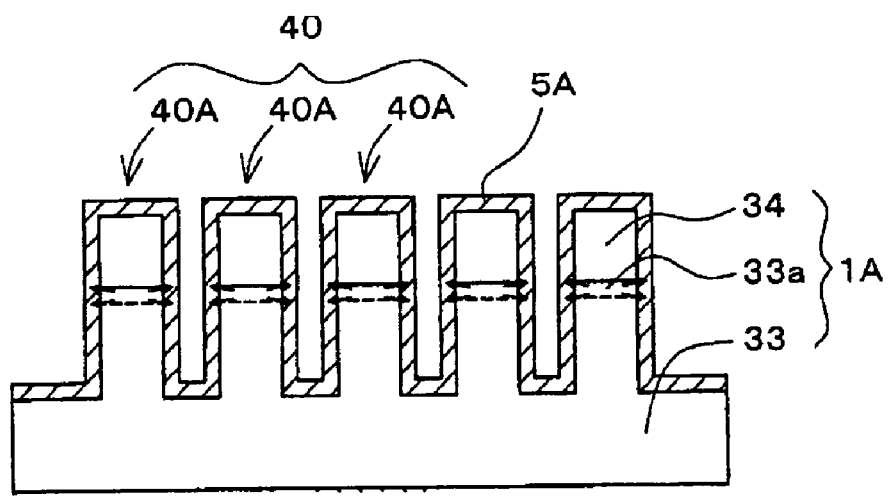
FIG. 10B is a schematic sectional view showing a sectional view along line b-b of FIG. 10A.

A field effect transistor according to the present embodiment, for example the FET shown in FIG. 2 or FIG. 10B, is manufactured as described below. In this embodiment, a GaN type HEMT is formed on a sapphire substrate by way of MOCVD, using a crystal growing apparatus. First, a sapphire substrate is set in a MOCVD reactor and the C-plane surface of the sapphire substrate is subjected to a heat-cleaning treatment in hydrogen atmosphere. Then, the temperature is lowered to 510° C., a buffer layer 21 made of GaN is grown to about 20 nm on the substrate in hydrogen atmosphere. Then, the temperature is raised to a crystal growth temperature and as a stacked layer structure that becomes a device structure, an undoped GaN layer of 3 μm (a portion near the interface between this undoped GaN layer and the barrier layer becomes the carrier transit layer 23 (corresponding to layer 33 of FIG. 10B), and as un upper layer 24 (corresponding to layer 34 of FIG. 10B) thereon, a barrier layer (7.5 nm) of i-type AlN made of undoped i-type AlN and a spacer layer (about 25 nm) of i-type AlGaN made of undoped $Al_{0.3}Ga_{0.8}N$ with Al composition of 0.3 are grown. By providing the undoped AlGaN layer, mobility in the channel can be further improved. The i-type $Al_{0.3}Ga_{0.8}N$ layer is considered to function as a carrier supply layer. After the reaction was completed, the temperature is reduced to room temperature and the obtained wafer is removed from the reaction vessel.

(Photolithographic Process)

Next, as a photolithographic process to form a mesa stripe structure, patterning is applied to a resist mask by using photolithographic technology and as shown in FIG. 2, etching is performed to a point deeper than the channel so that the side surface portion 140e of the channel 23a forming portion in the step portion is exposed by RIE. At this time, in an example of Example 3, a plurality of stripes 40A are formed as the step portion 40 to the AlGaN layer and GaN layer. Then, as the S-electrode 185 and D-electrode 186, 10 nm of Ti and 300 nm of Al are deposited in sequence by sputtering and an electrode of Ti/Al is formed by liftoff respectively. Thereafter, the electrode is annealed at 600° C. Next, using a sputtering apparatus, 100 nm of Ni and 150 nm of Au are deposited in sequence, and resist removal or liftoff is performed to make a Ni/Au Schottky electrode as a G-electrode 186. In Example 1, each distance $L_{SD}$ between the source and drain electrodes is set to about 19 μm and the width of the gate electrode (longitudinal direction) is set to about 100 μm.

When the device structure is such that the respective electrodes are formed with the semiconductor structure in between, for example, the G-electrode is at the carrier transit layer side and the S- and D-electrodes is at the mesa structure portion side, a G-electrode is formed by, for example, after attaching the electrode forming surface side of the mesa structure portion side to a support substrate, removing the substrate for growth by laser liftoff, and removing a part of the stacked layer structure such as the buffer layer by grinding.

Example 2

For purposes of describing this example, reference will be made to FIGS. 3 and 4. A HEMT element and a device thereof are formed. In which, plurality of mesa structure portions 241-243, which are the element region 211-213 shown as a part of a region 200a in the schematic cross-sectional view in FIG. 3, are formed in the carrier transit direction as the semiconductor device 200 shown in the schematic plan view in FIG. 4.

In a similar manner as in Example 1, with respect to the mesa structure portion corresponding to a device region, the G-electrode 186a, 186b, and 186c is provided to the upper step portion, and the S-electrode and D-electrode covering from the upper step portion to the side surface 240e and the lower step portion are provided. A 100 of element regions 211 to 213 of the mesa structure portion 240 (241 to 243) are formed, and as shown in the figure, the common electrodes 185C and 187C are provided between adjacent devices, and the S-electrode 185C and D-electrode 187C are provided so as to cover the area between adjacent mesa structures and straddle the groove portion 240g between the devices.

Figure 4:
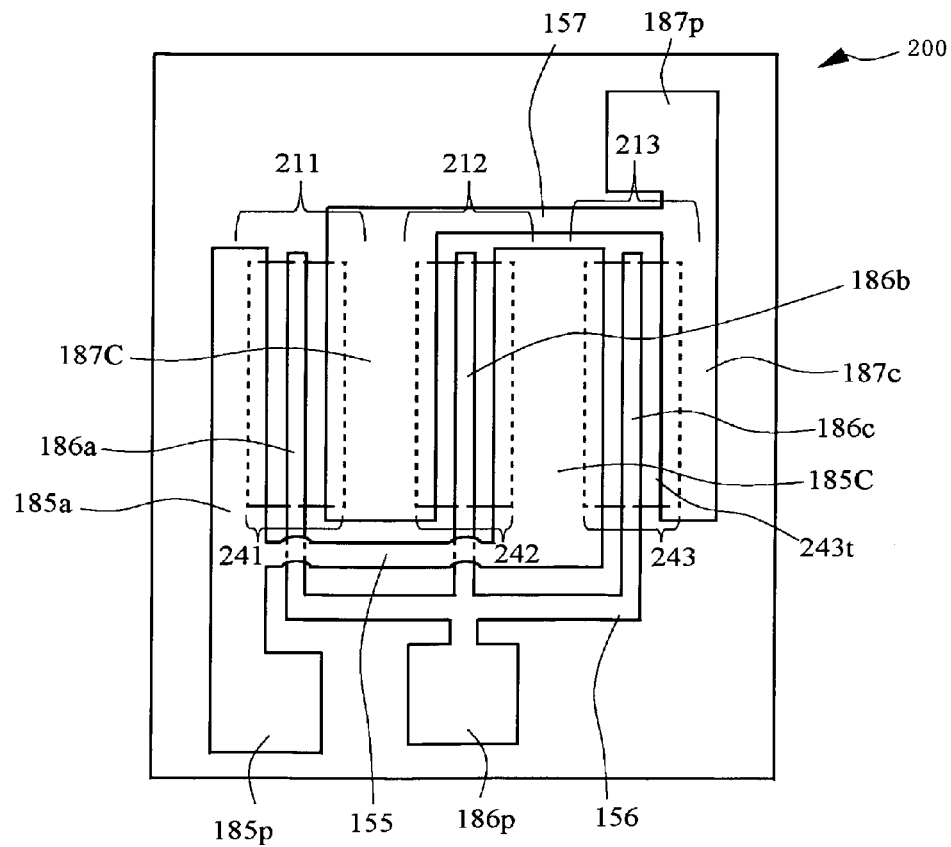
FIG. 4 is a schematic plan view showing an example of FET and device thereof according to an embodiment of the present invention.

Further, as shown in FIG. 4, the source electrode 185a and 185C, the gate electrode 186a and 186b and 186c, and the drain electrode 187C and 187c in each device region are connected to each other, in which the interconnecting members 155 to 157 for connecting each electrode are provided on the same plane as the S- and D-electrodes forming surface at the bottom surface of a groove 240g, and a pad 185p to 187p is respectively provided to each electrode.

(Packaging of Semiconductor Device)

After the device process is completed, each device unit is divided into device chips and the chip is mounted on a package. In the present example, a device unit comprises 100 pieces of element regions and a set of pad portions, with a total width of the gate electrodes of about 100 mm. By way of wire bonding, the pad portions 185p-187p of electrodes are connected to the electrodes of the package via wires. Whereas in the case of flip-chip bonding, that is a wireless bonding as in the above-described longitudinal FET structure in which the S- and D-electrodes and G-electrode are at opposed positions, an additional heat conducting substrate can be provided to the G-electrode side so that heat dissipation characteristics can be improved and the pads for wire bonding are unnecessary, therefore, it is suitable for downsizing. Also, it is advantageous that inductance due to wire and capacitance between wires and between the main bodies of the semiconductor devices can be reduced.

The HEMT semiconductor device obtained as described above can achieve the on-state resistance of 0.025 $\Omega \cdot cm^2$ at the operation of drain current over 1 A.

In addition, it is not applied only to this example, the carrier supply layer (typically an n-type AlGaN) of HEMT can be constructed suitable for a high-speed operation, by reducing the thickness to about 2.5 nm or less. With this, transit distance of electrons is reduced and the time for reaching is shortened, therefore, it is possible to form a structure adaptable to increasing aspect ratio, preventing short channel effect, and preventing leak current.

SECOND EMBODIMENT

In the present embodiment, a plurality of step portions or a plurality of recesses each having a step portion on the inner wall surface are formed in each electrode portion and its forming region. Illustrative embodiments include, forming the above at each electrode; forming the above at some of the S-, D-, and G-electrodes, for example, only at the S-electrode and D-electrode or only at the D-electrode; and forming the above between each electrode or between the S-electrode and the D-electrode, for example, a configuration in which the above is formed in the carrier transit region spreading out from the electrode forming region, and a configuration in which the above is formed in each electrode forming region and the region between thereof; and the like.

Examples of specific construction will be described below.

The FET of the first illustrative embodiment of the present invention comprises; a first semiconductor layer made of a nitride semiconductor, a second semiconductor layer formed on the first semiconductor layer and made of a nitride semiconductor having wider band gap energy than that of the first semiconductor layer and residual donor concentration of $5 \times 10^{19}/cm^{-3}$ or less, and a S-electrode, G-electrode and D-electrode respectively formed on the second semiconductor layer, wherein the S-electrode and/or the D-electrode are formed on a step portion which is formed on at least a part of the second semiconductor layer. With this structure, the contact area between the channel forming portion and the electrode at the step portion can be increased and the ohmic contact resistance can be reduced, so that efficiency can be improved.

In the second illustrative embodiment, the step portion is at least one of stripe structure, polygonal shape, and circular, when viewed from the S-electrode and D-electrode forming surface side. With this structure, the contact area of the interface with the electrodes at the step portion can be increased and the ohmic contact resistance can be reduced, so that efficiency can be improved.

In the third illustrative embodiment, the step portion is, when viewed from the S-electrode and D-electrode forming surface side, formed approximately planar and a planar step portion is extended so that an end surface thereof reaches at least one of the G-electrode and D-electrode, while straggling the S-electrode. With this structure, leakage of carriers from the end edge of the step portion can be reduced, and further, the value of resistance of the interface can be reduced.

In the fourth illustrative embodiment, a FET comprises a semiconductor stacked layer structure made by stacking a plurality of gallium nitride based compound semiconductor layers is provided. The semiconductor layer includes a carrier supply layer having a first surface and a second surface that is the opposite side of the first surface, and a carrier transit layer having a smaller band gap energy than that of the carrier supply layer and capable of forming a channel to a portion in contact with the second surface, and further comprises a D-electrode, G-electrode and D-electrode formed on the first surface of the carrier supply layer. The semiconductor layer comprises a plurality of step portions sunken to a depth exposing at least the channel forming portion at the first surface, and the S-electrode and D-electrode are formed on the step portion on the semiconductor layer, each establishing an ohmic contact at the interface with the step portion. With this structure, the contact area between the channel forming portion and the electrode at the step portion can be increased and the ohmic contact resistance can be reduced, so that efficiency can be improved.

In the fifth illustrative embodiment, the step portion is a stripe structure having a plurality of parallel portions extended on the semiconductor layer in the carrier transit direction in the channel, and the channel forming portion is in contact with the electrode at the side surface of the stripe structure. With this structure, the contact area between the channel forming portion and the electrode at the side surface of the step portion can be increased and the ohmic contact resistance can be reduced, so that efficiency can be improved.

In the sixth illustrative embodiment, the stripe structure further forms a protrusion in a direction perpendicular to the extending direction of the stripes. With this structure, the surface area can be further increased and the contact area with the electrodes at the side surface can be increased, so that it is possible to achieve lowering the resistance.

In the seventh illustrative embodiment, the step portion comprises a plurality of recesses formed in a polygonal shape from the surface of the semiconductor layer. With this structure, the surface area can be increased to increase the contact area with the electrodes, so that it is possible to achieve lowering the resistance.

In the eighth illustrative embodiment, the step portion comprises a plurality of recesses formed in a cylindrical shape from the surface of the semiconductor layer. With this structure, the surface area can be increased to increase the contact area with the electrodes, so that it is possible to achieve lowering the resistance.

In the ninth illustrative embodiment, a step portion is also formed on the forming surface of the G-electrode on the semiconductor layer. With this construction, forming process of the step portion can be facilitated.

In the tenth illustrative embodiment, the S-electrode and/or the D-electrode are stacked in layer on the first surface. As described above, when the S-electrode and/or the D-electrode are formed as the electrode layer, electrode formation to the step portion can be facilitated.

In the eleventh illustrative embodiment, the carrier concentration of the carrier supply layer is $10^{19}$ cm$^{-3}$ or less. With this, a GaN-based field effect transistor with a high breakdown voltage can be obtained.

In the twelfth illustrative embodiment, a HEMT is provided. With this, a GaN-based HEMT with high efficiency having a low contact resistance in Ohmic contact can be obtained.

The thirteenth illustrative embodiment concerns a manufacturing method of a field effect transistor comprising a carrier transit layer and carrier supply layer formed on the carrier transit layer and having a band gap energy greater than that of the carrier transit layer. The manufacturing method comprises a process for forming a plurality of step portions which are sunken to a depth where at least the channel forming portion is exposed at the surface of the carrier supply layer, in a condition in which the carrier supply layer is stacked on the carrier transit layer, and a process for forming the S-electrode and D-electrode respectively in a layer shape on the step portions and obtaining ohmic contact at the interface between the step portions and the electrode layers. With this structure, the contact area between the channel forming portion and the electrode at the step portion can be increased and the ohmic contact resistance can be reduced, so that efficiency can be improved.

Each illustrative embodiment according to the second embodiment will be described specifically below. Also, the present invention is applicable in combination with the above-described first and second embodiments and each illustrative embodiment.

(Step Portion 40)

Figure 10C:
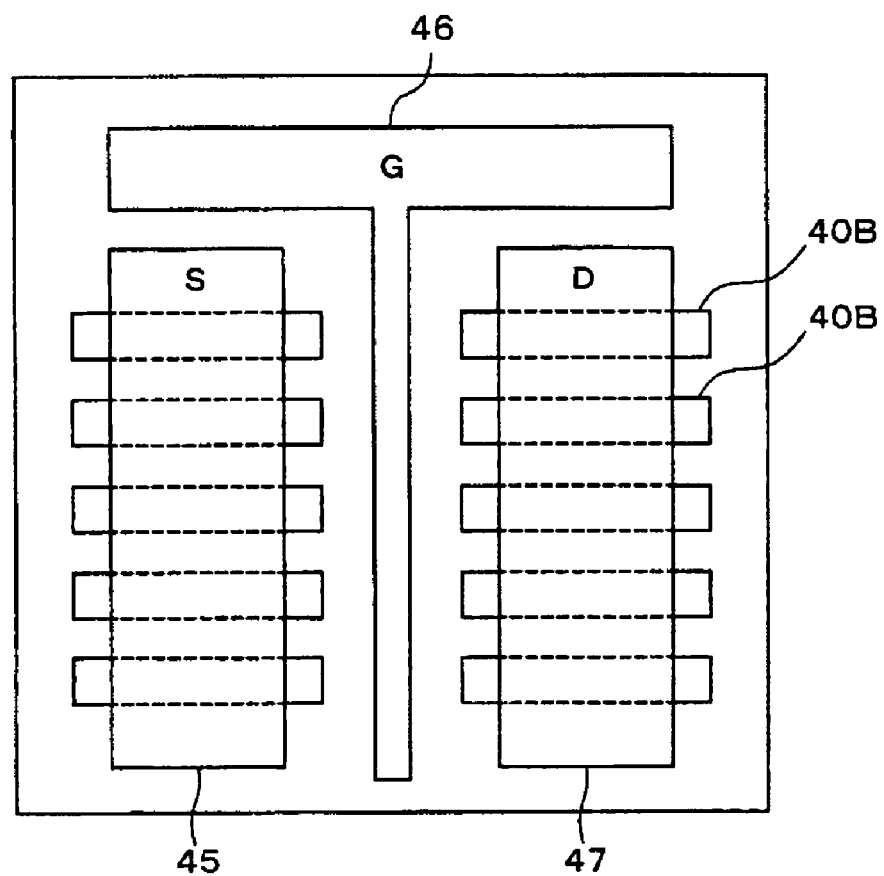
FIG. 10C is a schematic plan view showing an example of electrode structure of FET of a variational example of an embodiment of FIG. 10A.

In the present embodiment, a step portion 40 is formed at a location for forming an electrode in an upper surface of the semiconductor layer 1A (FIG. 10B) so as to reduce the contact resistance at least between the semiconductor layer 1A, which includes the carrier transit layer 33 and the carrier supply layer 34 which is the upper layer of the carrier transit layer, and the electrode layer 5A. The step portion 40 is formed in a pattern with recesses, which may be seen as protrusions or projected portions when viewed from the bottom surface. In addition, an electrode is formed in layer thereon. An example of such electrode formation will be described below with reference to FIG. 10 to FIG. 12. FIG. 10A shows a plan view of the electrodes of HEMT according to Embodiment 1, FIG. 10B shows a cross section taken along line b-b of FIG. 10A, and FIG. 10C shows a variation of FIG. 10A, respectively. In the example in FIG. 10, as shown in the plan view in FIG. 10A, on the upper surface of the carrier transit layer 33, the surface which is in contact with the S-electrode 35 and the D-electrode 37 is formed in a mesa structure in which a plurality of stripes 40A are formed as the step portion 40. Further, the S-electrode 35 and the D-electrode 37 are formed on the surface of the mesa structure, and as shown in the sectional view in FIG. 10B, the surface having patterned indentations is covered. With this structure, the contact area, where the electrode layer 5A and the semiconductor layer 1A are ohmically connected, increases so that the contact resistance can be reduced. At this time, the end surface of the channel 33a forming portion of the carrier transit layer 33 is exposed to be in contact with the electrode at each side surface of the mesa. Especially, in the electrode configuration covering the entire protruded semiconductor layer, if the carrier supply layer has a low resistance, electric current can be applied upward via the AlGaN layer 14. However, when the amount of doping in the AlGaN layer 14 is reduced, the carrier concentration is reduced. Accordingly, the amount of upward current is reduced. Especially, in order to further improve the high breakdown voltage which is one of characteristics of GaN-based HEMT, AlGaN layer is preferably formed substantially undoped. However, with this arrangement, the amount of applied electric current via AlGaN layer will be greatly reduced, as described above. As a result, current is applied mainly to the junction surface between the end surface of the channel 13a and the electrode layer 5. Because the contact area between the channel 13a and the electrode layer 5 is small, the contact resistance increases. Thus, there has been a problem that power dissipation due to heat generation etc. increases accordingly. Therefore, as shown in FIG. 10B, by forming the semiconductor layer 1A with a patterned indentation, the contact area between the semiconductor layer 1A and the electrode layer 5A is increased. Especially the contact area between the channel 33a and the electrode layer 5A is increased to increase the amount of current from the channel 33 flowing through the side surface. Thus, the overall resistance is reduced.

The bottom portion of the step portion 40 is preferably made so that it reaches at least the carrier supply layer 34, and is deeper than the channel 33a forming portion to a degree that the channel 33a forming portion exposes at the side surface of the step portion 40. The step portion 40 is formed extended, along the carrier flow direction in the channel 33a, that is, in the horizontal direction in the example shown in FIG. 10. Especially in the example shown in FIG. 10, the step portion is formed as a series of stripes 40A including the G-electrode portion. With this arrangement, the contact area with the semiconductor layer 1A in the valley portion among the slits can be increased. Further, the S-electrode 35 and the D electrode 37 can be formed with one stripe, therefore, formation process of the step portion 40 can be facilitated compared with the process in which the step portion of the S-electrode and the D-electrode are formed separately. In addition, because from the S-electrode 35 to the D-electrode 37 are made in one stripe, among electric current flowing between the S- and D-electrodes and the channel, a portion through the carrier layer can be reduced. Accordingly, it is also possible to reduce the resistance.

Further, by forming the G-electrode in the step portion, extraction of positive holes from the side surface of the step portion to the G-electrode can be performed, and with this arrangement, the breakdown voltage can be further improved. That is, in the band structure of the Schottky contact of the G-electrode, the potential energy at the gate side is lower for the positive holes, so that the positive holes generated in the channel are attracted to the gate side having a lower potential energy, and are discharged to external circuit from the gate.

As a variation example of above-described FIG. 10A and shown in FIG. 10C, the step portion 40B may be formed only to the formation portion of the S-electrode 45 and the D-electrode 47, excluding the portions between the source and drain electrodes and over the G-electrode. The reference numeral 40B indicates a recess portion. With this arrangement, the carrier transit region between the source and drain electrodes increases compared with FIG. 10A. As an another example, in order to obtain a wider contact area between the S-electrode and the D-electrode and the semiconductor layer, a plurality of protrusions having a rectangular planar shape protruding from a side surface of the stripe-shaped step portion may be formed on one step portion. For example, the protrusions are formed in a direction perpendicular to the stripes. With this arrangement, although the manufacturing of the step portion becomes complicated, a HEMT device of high efficiency having further wider contact area can be obtained. The size of the protrusions can be made in a variety of sizes by etching etc., and a smaller size is preferable. However, in view of reduction in the breakdown voltage and contact resistance while maintaining the properties of GaN-based HEMT, 0.01 µm or more and 1 µm or less is preferable. Further minute protrusions may be formed on the protrusions.

As a specific example, in order to obtain a wider contact area between the S-electrode and the D-electrode and the semiconductor stacked layer structure, another step portion in a planar protrusion may be formed from the side surface of the striped-shape step portion. For example, the protrusions are formed in a direction perpendicular to the stripes. In this example, the G-electrode portion is made as a flat surface. With this arrangement, although the manufacturing of the step portion becomes complicated, a HEMT device of high efficiency having further wider contact area can be obtained. The size of the protrusions can be made in a variety of sizes by etching etc., and a smaller size is preferable. However, in view of reduction in the breakdown voltage and contact resistance while maintaining the properties of GaN-based HEMT, 0.01 µm or more and 1 µm or less is preferable. Further minute protrusions may be formed on the protrusions. Moreover, in order to increase the side surface area, the step portion may be made not only in sequential stripes but also in segments.

Figure 11:
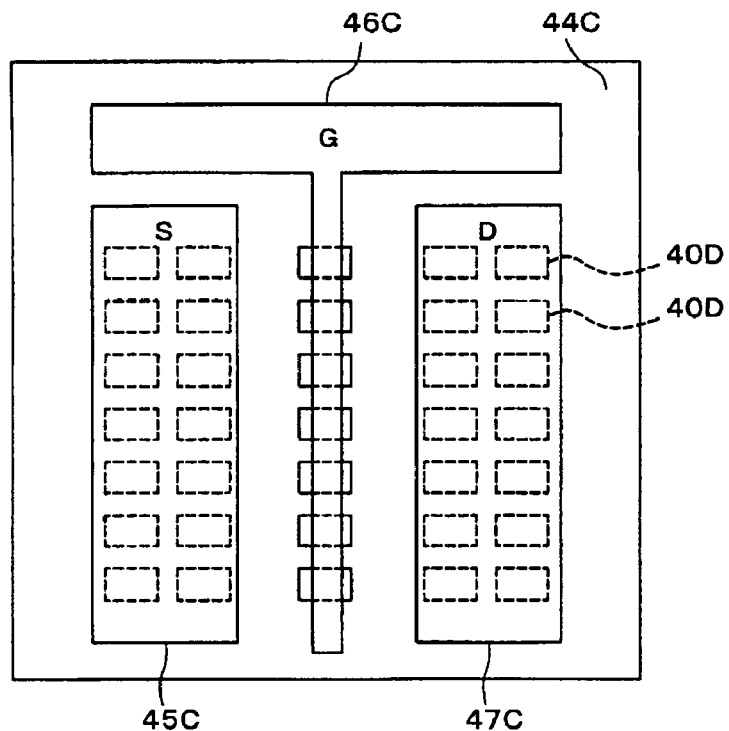
FIG. 11 is a schematic plan view showing an example of electrode structure of FET according to an embodiment (second embodiment) of the present invention.

As another illustrative example which is shown in FIG. 11, a plurality of rectangular step portions 40D are formed with a predetermined intervals so as to overlap to the S-electrode 45C and D-electrode 47C forming portions including the G-electrode 46C portion formed on the semiconductor layer 44C. In this example, rectangular-shaped 40Ds are arranged in grid form. However, it is needless to say that they can be also arranged in offset form. Alternately, it is not limited to a rectangular shape, a variety of recess patterns can be adopted. For example, a columnar step portion may be formed overlapping to the S-electrode 55 and D-electrode 57 forming portions, and not to the G-electrode. When the step portion is a columnar shape recess, it can be formed easily by photolithography, which can provide good mass productivity. The region where the carriers are extracted by the ohmic electrode, that is, a diffusion length, is typically about from 2 to 3 µm. Therefore, the size of the recessed pattern, in other words, a distance between recesses such as adjacent column-shaped recesses is preferably about 1 µm or less.

Figure 12:
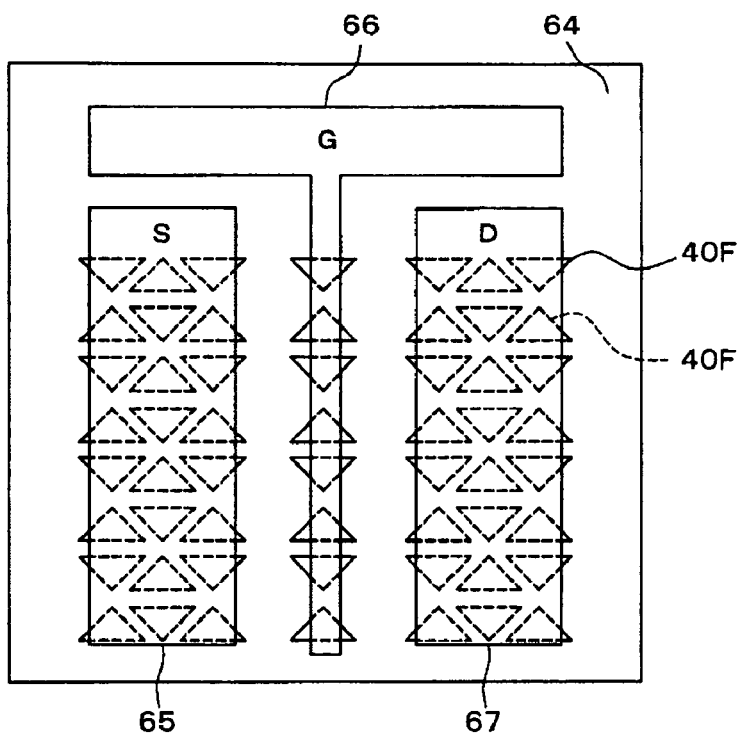
FIG. 12 is a schematic plan view showing an example of electrode structure of FET according to an embodiment (second embodiment) of the present invention.

In addition, as a variation example thereof shown in FIG. 12, a plurality of triangular prism shaped step portions 40F are formed so as to overlap with the S-electrode 65 and D-electrode 67 forming portion including the G-electrode 66 portion formed on the semiconductor layer. Especially, when employing a rectangular shape among polygonal shapes, the surface area can be maximized, so that it is specifically advantageous in viewpoint of increasing the contact area. In order to form a fine recess pattern such as a triangle, electron beam lithography or the like is suitably used. In addition, in a variation example, a plurality of step portions are formed with hexagonal cylinder shaped recesses, so as to overlap the formation portion of the S-electrode and D-electrode including the G-electrode. With this, accuracy in photolithography is not needed and formation can be carried out easily with a good yield.

As described above, the step portion can be formed in a patterned indentation with a variety of patterns such as polygons, circulars, and ellipses. Shape and size of the step portion depend on the size of the field effect transistor, the size of the electrodes, and the processing accuracy etc., and suitably set so as to obtain ohmic contact with a low resistivity, by exposing the channel forming portion at the interface between the semiconductor layer and the electrode layer, especially at the side surface portion. Further, not only to a columnar shape, but also a prism shape, which is a column with slanted side surfaces and approximately flat top surface, can be employed. Further, in order to obtain a low resistivity by increasing the contact area, such patterned indentation is not needed to be strictly within the region for forming the electrodes, and may be formed so as to partially stick out from the electrode forming region. It is sufficient to form the indented pattern to a degree capable of reducing the contact resistance between the electrode and the semiconductor layer, so that accuracy of positioning when forming the electrode associated with formation of the indented pattern is not needed to be enforced so much, lowering the cost of manufacturing can be obtained without reducing the yield. In addition, by providing the electrode layers in contact with the channel forming portion, the amount of electric current flowing from the channel through the side wall of the step portion can be increased, and thereby lowering the resistivity can also be obtained. This is because especially when the value of resistivity of the carrier supply layer is high, flowing from the channel through the side wall can be attained with lower resistance. In order to increase the electric current passing into the side wall, the electric current passing into the carrier supply layer is relatively reduced. For this, for example, a structure such as described in Example 3 can be adopted.

Example 3

Figure 13:
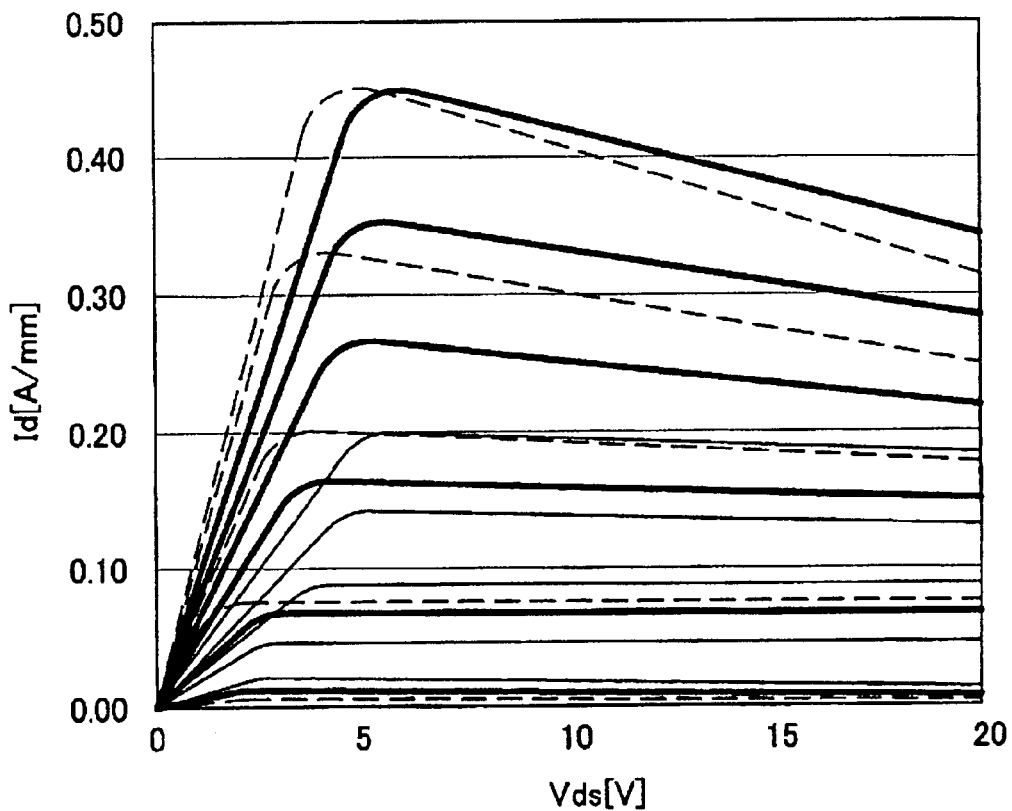
FIG. 13 is a graph showing static characteristic of a HEMT according to Example 3 and Comparative Examples 2 and 3 of the present invention.

Next, as GaN-based HEMT, Example 3 in which the stripes shown in FIG. 10A (10B) are formed as the step portion and Comparative Example 2 in which the stripes are not formed as the step portion are compared. In the GaN-based HEMT of Example 3, an undoped i-type GaN layer as the carrier transit layer and 30 nm of an undoped i-type AlGaN layer thereon as the carrier supply layer are stacked, and stripes (5 µm in width, 170 µm in length) are formed as the step portion. Comparative Example 2 is carried out in a similar manner as in the above, except that the stripes are not formed. In Comparative Example 3, a GaN-based HEMT is formed in a similar manner as in Comparative Example 1, except that as the upper layer, a 6 nm of i-type AlGaN as the spacer layer and a 12 nm of n-type AlGaN layer doped with $1 \times 10^{19}$ $cm^{-3}$ of Si as the carrier supply layer are stacked. The static characteristics obtained in these HEMT devices are shown in FIG. 13. In this figure, Example 1 in a heavy line, Comparative Example 1 in a thin solid line, and Comparative Example 2 in a dashed line are respectively shown. As shown in this figure, Example 3 in which the stripes are formed, the maximum value of the drain current Id can be increased equal or greater than twice the value of that in Comparative Example 1 in which the stripes are not formed. The HEMT of Example 1, the drain current of the same level can be obtained even compared with the HEMT of Comparative Example 2. As described above, according to the present example, more drain current can be obtained by forming the step portion. Also, even in the case where an undoped carrier supply layer is used, a similar amount of the drain current can be obtained as in the case where a doped carrier supply layer is used. Accordingly, the on-resistance of the HEMT device can be reduced, so that improvement of efficiency and a higher withstand voltage can be obtained. Therefore, it can be applicable in the HEMT device having further high output power. Such features described above are of important advantage for the GaN-based HEMT devices aiming to achieve high output power at high frequencies.

Example 4

Figure 9:
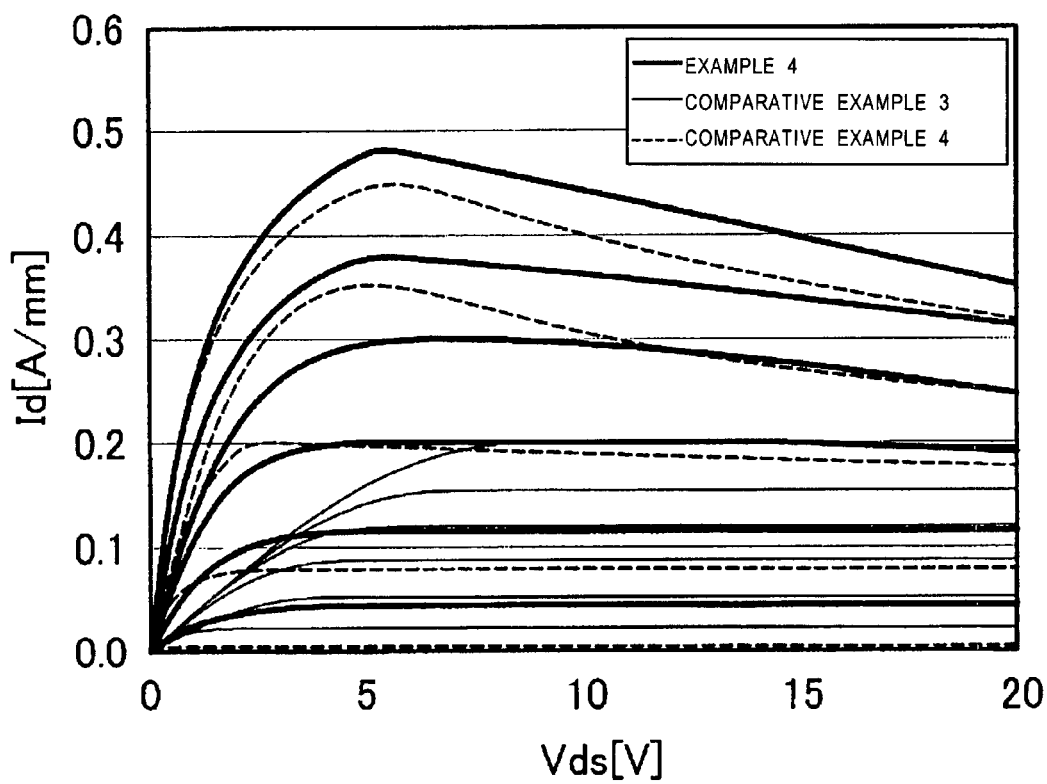
FIG. 9 is a graph showing static characteristic of a HEMT according to Example 4 and Comparative Examples 4 and 5 of the present invention.

As Example 4, a HEMT is formed, in which the triangular step portions as shown in FIG. 12 are formed on the surface of the upper layer on the carrier transit layer by using the undoped AlN layer of the spacer layer and the undoped AlGaN layer of the carrier supply layer. Further, as Comparative Example 4, a HEMT is formed in which a step portion is not formed, as Comparative Example 5, a HEMT is formed in which an undoped AlGaN layer for the spacer layer and an n-type AlGaN layer for the carrier supply layer are used and a step portion is not formed. FIG. 9 shows drain current $I_D$ versus drain to source voltage $V_{DS}$, as static characteristic obtained by these HEMT. In FIG. 9, a heavy line shows Example 4, a thin line shows Comparative Example 4, and a dashed line shows Comparative Example 5, respectively. Here, the gate voltage $V_G$ is changed from 1V to −6V at intervals of 1V.

As shown in FIG. 9, in the HEMT having the spacer layer made of AlN, the drain current can be exponentially increased by forming the step portion. Higher drain current has been achieved even compared with the HEMT having more carriers and in which n-type AlGaN layer is used for the carrier supply layer instead of undoped AlGaN layer. Naturally, the breakdown voltage of the HEMT of Comparative Example 5 having n-type AlGaN layer as the carrier supply layer is relatively low. Conventionally, when the spacer layer is made of AlN rather than AlGaN, the carrier mobility increases. However, there has been a problem in which the barrier is increased, resulting in greater contact resistance However, the contact resistance can be reduced by applying the electrode structure of the present embodiment, therefore, it is significantly advantageous. As described above, advantage of applying the present embodiment to the HEMT using an undoped AlN layer for the spacer layer can be confirmed.

In each example shown above (first and second embodiments etc.), the present invention is described with an example in which the present invention is applied to a GaN-based HEMT. However, the present invention can also be applicable to other III-V based semiconductors such as GaAs and the like. Especially, because the GaAs compound semiconductor is a narrow gap semiconductor having a small bandgap, ohmic contact from upper portion can be obtained relatively easily even if the carrier supply layer is undoped. Therefore, although the structure according to the present invention does not necessarily provide a drastic improvement, its practical utilization is possible. On the one hand, by using the structure of the present invention in the GaN-based HEMT which is a wide gap semiconductor, superiority specific to GaN whose physical properties are more excellent than GaAs can be further utilized, so that devices of higher performance can be obtained.

INDUSTRIAL APPLICABILITY

The field effect transistor of the present invention can also be utilized in the devices such as MISFET and MOFSET, other than in the HEMT described above having higher electron mobility in the carrier transit layer. Also, as the device structure and mounting structure, the present invention can be applied to such as a flip-chip type mounting having a face-down structure, and a longitudinal FET having a structure in which respective electrodes are facing each other at the both sides of the semiconductor structure.

What is claimed is:
1. A field effect transistor comprising:
a stacked layer structure provided with a plurality of nitride semiconductor layers, the stacked layer structure including a carrier transit layer;
a gate electrode provided on the stacked layer structure; and
a source electrode and drain electrode provided on the stacked layer structure in such manner that the gate electrode is placed between the source and drain electrodes;
wherein:
the stacked layer structure has a step portion having inclined side surfaces exposing respective end portions of the carrier transit layer to the source electrode and drain electrode, the inclined side surfaces extending from a lower step of the step portion to an upper step of the step portion,
the source and drain electrodes are respectively connected to the end portions of the carrier transit layer, and are provided respectively on the inclined side surfaces of the step portion, and
parts of the source electrode and drain electrode are provided respectively on a surface of an upper step of the step portion.
2. The semiconductor device according to claim 1,
wherein each of the respective parts of the source electrode and the drain electrode provided on the upper step of the step portion have extend, in carrier transit direction, a distance L μm from the respective side surface toward the gate electrode, the distance L being within a range of 0.1 to 5 μm.
3. The field effect transistor according to claim 2, further comprising a semiconductor device,
wherein:
a mesa structure portion is placed between the side surfaces of the step portion as an element region,
a plurality of element regions are formed in the stacked layer structure, and
source electrodes and drain electrodes are respectively provided straddling adjacent element regions.
4. The semiconductor device according to claim 3,
wherein in the stacked layer structure, each source electrode and drain electrode straddling the same adjacent element regions are connected to each other by an interconnecting member on the electrode forming layer at the lower step of the step portion among the mesa structure portions.

5. A field effect transistor comprising:
a stacked layer structure provided with a plurality of nitride semiconductor layers, the stacked layer structure including a carrier transit layer;
a gate electrode provided on the stacked layer structure; and
a source electrode and drain electrode provided on the stacked layer structure in such manner that the gate electrode is placed between the source and drain electrodes;
wherein:
the stacked layer structure has a step portion having inclined side surfaces exposing respective end portions of the carrier transit layer to the source electrode and drain electrode, the inclined side surfaces extending from a lower step of the step portion to an upper step of the step portion,
the source and drain electrodes are respectively connected to the end portions of the carrier transit layer, are provided respectively on the inclined side surfaces of the step portion,
parts of the source electrode and drain electrode are provided respectively on a surface of an upper step of the step portion, and
a contact resistance of the source electrode and drain electrode at the upper step of the step portion is higher than a contact resistance of the source electrode and drain electrode at the end portions of the carrier transit layer at the side surfaces connected to the source electrode and drain electrode.

6. The field effect transistor according to claim 5, wherein:
the stacked layer structure has the gate electrode at on the surface of the upper step portion, and
the cross-section in a width direction of the gate electrode has a mesa structure portion in which a mesa shape of the gate electrode side has a narrower width than the carrier transit layer.

7. The field effect transistor according to claim 6, wherein the stacked layer structure comprises a first semiconductor layer having a carrier transit layer, and a second semiconductor layer of a nitride semiconductor having a larger band gap energy than that of the carrier transit layer on the first semiconductor layer,
parts of the source electrode and drain electrode are provided respectively on the surface of the second semiconductor layer,
the source electrode and drain electrode extend to a lower step of the step portion, and
the nitride semiconductor layer at the lower step is the same nitride semiconductor layer as the carrier transit layer.

8. The field effect transistor according to claim 5, wherein each of the parts of the source electrode and drain electrode provided respectively on the upper step of the step portion extend, in a carrier transit direction, a distance L from the respective side surface toward the gate electrode side, the distance L being within a range of 0.5 to 5 µm.

9. The field effect transistor according to claim 8, wherein in the carrier transit direction, a ratio $d_e/L$ between a lateral width $d_e$ of the side surface of the step portion and the distance L is within a range of 1 to 1/10, and a ratio $h/d_e$ between a height h of the step portion and the width $d_e$ is within a range of 1/7 to 1/3.

10. The field effect transistor according to claim 5, wherein in an electrode forming surface, the stacked layer structure comprises a groove surrounded by a step portion or a groove including a plurality of step portions, and a plurality of grooves are provided in the source electrode and drain electrode.

11. The field effect transistor according to claim 10, wherein the groove has a longitudinal shape extending in the carrier transit direction.

12. The field effect transistor according to claim 11, wherein the groove is provided extended between the source electrode and drain electrode.

13. A field effect transistor comprising:
a stacked layer structure provided with a plurality of nitride semiconductor layers, the stacked layer structure including a carrier transit layer;
a gate electrode provided on the stacked layer structure; and
a source electrode and a drain electrode provided on the stacked layer structure in such manner that the gate electrode is placed between the source and drain electrodes,
wherein:
the stacked layer structure has a step portion having inclined side surfaces exposing respective end portions of the carrier transit layer to the source electrode and drain electrode, the inclined side surfaces extending from a lower step of the step portion to an upper step of the step portion,
the source and drain electrodes are respectively connected to the end portions of the carrier transit layer, and are provided respectively on the inclined side surfaces of the step portion,
parts of the source electrode and drain electrode are provided respectively on an upper surface of the step portion, and
each of the parts of the source electrode and drain electrode provided on the upper step of the step portion extend, in carrier transit direction, a distance L from the respective side surface toward the gate electrode side, the distance L.

14. The field effect transistor according to claim 13, wherein:
the stacked layer structure comprises a first semiconductor layer having a carrier transit layer, and a second semiconductor layer of a nitride semiconductor having a larger band gap energy than that of the carrier transit layer on the first semiconductor layer, and
parts of the source electrode and drain electrode are provided respectively on the surface of the second semiconductor layer.

15. The field effect transistor according to claim 13, wherein the source electrode and drain electrode extend to a lower step of the step portion, and the nitride semiconductor layer at the lower step is the same nitride semiconductor layer as the carrier transit layer.

16. The field effect transistor according to claim 13, wherein:
the gate electrode is provided at the upper step of the step portion, and
the cross-section in a width direction of the gate electrode has a mesa structure portion in which a mesa shape of the gate electrode side has a narrower width than the carrier transit layer.

17. The field effect transistor according to claim 13, wherein in the carrier transit direction, a ratio $d_e/L$ between a lateral width $d_e$ of the side surface of the step portion and the distance L is within a range of 1 to 1/10, and a ratio $h/d_e$ between a height h of the step portion and the width $d_e$ is within a range of 1/7 to 1/3.

18. The field effect transistor according to claim 13, wherein in an electrode forming surface, the stacked layer structure comprises a groove surrounded by a step portion or a groove including a plurality of step portions, and a plurality of grooves are provided in the source electrode and drain electrode.

19. The field effect transistor according to claim 18, wherein the groove has a longitudinal shape extending in the carrier transit direction.

20. The field effect transistor according to claim 19, wherein the groove is provided extended between the source electrode and drain electrode.

21. The semiconductor device according to claim 13, wherein:

the distance L is $\geqq 1$ µm, and a contact resistance Rc of each of the respective parts source and drain electrodes provided on the upper step of the step portion, as determined by the transmission line measurement (TLM) method, is within a range of 2 to 5 Ω/mm.

* * * * *

UNITED STATES PATENT AND TRADEMARK OFFICE
CERTIFICATE OF CORRECTION

PATENT NO. : 8,242,539 B2  Page 1 of 1
APPLICATION NO. : 11/886451
DATED : August 14, 2012
INVENTOR(S) : Yuji Ohmaki It is certified that error appears in the above-identified patent and that said Letters Patent is hereby corrected as shown below:

IN THE CLAIMS:

In claim 13, at column 24, line 38, change "L." to --L $\leq$ 10 μm.--

In claim 21, at column 26, last line thereof, change "Ω/mm" to --Ωmm--.

Signed and Sealed this
Twenty-third Day of October, 2012

David J. Kappos
*Director of the United States Patent and Trademark Office*